United States Patent [19]

Suwa et al.

[11] Patent Number: 5,537,351
[45] Date of Patent: Jul. 16, 1996

[54] SEMICONDUCTOR MEMORY DEVICE CARRYING OUT INPUT AND OUTPUT OF DATA IN A PREDETERMINED BIT ORGANIZATION

[75] Inventors: Makoto Suwa; Yoshikazu Morooka; Kiyohiro Furutani, all of Hyogo, Japan

[73] Assignee: Mitsubishi Denki Kabushiki Kaisha, Tokyo, Japan

[21] Appl. No.: 301,754

[22] Filed: Sep. 7, 1994

[30] Foreign Application Priority Data

Sep. 16, 1993 [JP] Japan .................................. 5-229996

[51] Int. Cl.$^6$ ........................................... G11C 8/00
[52] U.S. Cl. ............. 365/189.02; 365/201; 365/230.02
[58] Field of Search ........................... 365/201, 51, 63, 365/189.01, 189.02, 205, 230.01, 230.02, 230.03

[56] References Cited

U.S. PATENT DOCUMENTS

| | | | |
|---|---|---|---|
| 4,899,313 | 2/1990 | Kumanoya | 365/201 |
| 4,907,203 | 3/1990 | Wada | 365/230.03 X |
| 4,956,811 | 9/1990 | Kajigaya et al. | 365/51 |
| 5,016,220 | 5/1991 | Yamagata | 365/201 |
| 5,400,281 | 3/1995 | Morigami | 365/201 |

FOREIGN PATENT DOCUMENTS 64-73597  3/1989  Japan .

*Primary Examiner*—David C. Nelms
*Assistant Examiner*—Son Mai
*Attorney, Agent, or Firm*—Lowe, Price, LeBlanc & Becker

[57] ABSTRACT

In a general read out operation, data read out from a memory cell array is amplified by a preamplifier group. The amplified data is provided to a selector unit. The selector unit responds to a bit organization select signal to select data according to a predetermined bit configuration. The selected data is provided to a data bus. In a test mode, the selector unit responds to a test mode signal to provide a test result to a data bus corresponding to a predetermined bit organization. Therefore, only the required data bus is used according to the bit organization and the test mode.

16 Claims, 17 Drawing Sheets

SEMICONDUCTOR MEMORY DEVICE CARRYING OUT INPUT AND OUTPUT OF DATA IN A PREDETERMINED BIT ORGANIZATION

BACKGROUND OF THE INVENTION

1. Field of the Invention

The present invention relates to semiconductor memory devices, and more particularly, to a semiconductor memory device carrying out data input/output in a predetermined bit organization out of a plurality of bit organizations.

2. Description of the Background Art

Semiconductor devices are now used in various types of equipments. Semiconductor memory devices are developed that can have the input/output unit of data, i.e. the bit organization, selected, according to the needs of the user for the sake of consistency with the device to be used. Such a semiconductor memory device is disclosed in Japanese Patent Laying-Open No. 64-73597.

This conventional semiconductor memory device will be described hereinafter with reference to the block diagram of FIG. 18.

Referring to FIG. 18, a semiconductor memory device includes a refresh address counter RCTR, a row address buffer RADB, a column address buffer CADB, a nibble counter NCTR, a prerow address decoder PRDCR, a redundant address select circuit RAC, a precolumn address decoder PCDCR, an address signal change detection circuit ATD, a timing generation circuit TG, row address decoders RDCR0–RDCR3, N type sense amplifiers SAN0–SAN3, memory arrays MARY0–MARY3, P type sense amplifiers SAP0–SAP3, column switches CS0–CS3, column address decoders CDCR0–CDCR3, main amplifiers MA0–MA7, test logic circuit TL, data output buffers DOB1–DOB4, data input buffers DIB1–DIB4, and a voltage generation circuit VG.

The semiconductor device of the above-described structure amplifies data stored in a predetermined memory cell of memory arrays MARY0–MARY3 specified by an address signal by main amplifiers MA0–MA7 to provide the amplified data to test logic circuit TL and data output buffers DOB1–DOB4.

Data output buffers DOB1–DOB4 and test logic circuit TL will be described in detail hereinafter with reference to FIG. 19 showing the structure of the data output buffer and the test logic circuit of FIG. 18.

Data is read out to an I/O line from a memory cell selected by a row address signal and a column address signal. The data read out to the I/O line is amplified by main amplifiers MA0–MA7 to be provided to a data bus. In the above-described conventional semiconductor memory device, a bit organization of x1 bit or x4 bits can be selected by selectively using different types of photomasks created in advance. In either case of a x1 organization or a x4 bit organization, output signals MO1–M03, /MO0–/M03 ("/" indicates an inverting signal) of main amplifiers MA0–MA3 are simultaneously output as 4 bits to be input to respective data output buffers DOB1–DOB4.

In a x4 bit organization, output signals MO0–M03 and /MO0–/MO3 are provided to respective data output buffers DOB1–DOB4, whereby 4 bits of output data D1–D4 are output.

In a x1 bit organization, one complementary signal out of the four complementary signals MO0–M03,/MO0–/M03 is selected by address signals AXY0–AXY3 which are entered to test logic circuit TL. The selected complementary signal is provided to data output buffer DOB3. Data output buffer DOB3 outputs data of 1 bit from the input complementary signal.

Test logic circuit TL functions to test the match/mismatch of the read out data of 4 bits. When a test mode signal TE attains a H level (high potential), signals mp0–mp3 attain a H level simultaneously by signal DS irrespective of address signals AXY0–AXY3. When signals mp0–mp3 attain a H level, output signals MO0–M03, /MO0–/M03 of main amplifiers MA0–MA3 are provided to respective 4-input NAND gates. When all the data of 4 bits read out from memory cell array MARY0–MARY1 attain a H level, all output signals MO0–M03 and/MO0–/M03 attain a H level and a L level (ground potential), respectively. Therefore, a signal of a L level is output from a data output pad $D_{out}$. When all the read out data of 4 bits attain a L level, output signals MO0–M03 and/MO0–/M03 attain a L level and a H level, respectively. Therefore, a signal of a H level is output from data output pad $D_{out}$. When at least 1 different data bit of the 4 bits of data is read out, the output of the 4 NAND gate to which output signals MO0–M03 are input and the output of the 4 NAND gate to which output signals/MO0–/M03 are input all attain a H level, whereby data output pad $D_{out}$ attains a high impedance state. Thus, when test mode signal TE receives a H level signal, match/mismatch of the 4 bits of data read out from memory cell arrays MARY0–MARY1 can be detected.

As described above, a conventional semiconductor memory device can be selectively produced to employ a x1 bit organization or a x4 bit organization by partially modifying the photomask to meet the needs of the user.

A conventional semiconductor memory device amplifies data read out from a memory cell with a main amplifier, whereby the amplified data is input to a data output buffer and a test logic circuit via a data bus. All the read out data in the x1 bit organization and the x4 bit organization is transferred via a data bus, so that the access time was determined by the data bus of the longest transfer time period when the data buses have different transmission time periods. This means that an unrequired data bus is used in a 1 bit organization and the access time is dependent upon by the data bus having the longest data transmission time. There was the problem that access required a longer time.

Because all the data buses are used, there was also a problem that power consumption is increased due to charge/discharge of unrequired data buses.

SUMMARY OF THE INVENTION

An object of the present invention is to provide a semiconductor memory device that has operating speed increased and power consumption reduced.

Another object of the present invention is to provide a semiconductor memory device that can easily carry out bit organization switching and test mode switching.

A further object of the present invention is to provide a semiconductor memory device suitable for increase in integration density.

A semiconductor memory device according to an aspect of the present invention includes a plurality of memory blocks for storing data, a plurality of preamplifiers provided corresponding to the plurality of memory blocks for amplifying selected data, and an output select circuit receiving an output signal from the plurality of preamplifiers and a mode select signal to select one mode out of at least 3 modes for selecting and providing output signals of the plurality of preamplifiers at respective different states according to the mode select signal.

According to the above-described structure, a desired mode can be selected from at least 3 modes to output desired data. Therefore, the bit configuration and the test mode can be easily switched to a desired one.

A semiconductor memory device according to another aspect of the present invention includes a memory cell array having a plurality of memory blocks, a preamplifier group having a plurality of preamplifiers provided corresponding to the plurality of memory blocks, and a plurality of select units provided corresponding to the preamplifier group, receiving an output signal from the plurality of preamplifiers for selecting an output signal of the plurality of preamplifiers at respective difference states according to the plurality of mode select signals, and for outputting the selected output signal.

According to the above-described structure, an output signal of a plurality of preamplifiers can be selected at a desired state to be output by a plurality of select units according to a plurality of mode select signals. Therefore, a bit organization and a test mode can easily be switched to desired ones.

According to still another aspect of the present invention, a semiconductor memory device includes a plurality of memory blocks storing data, a plurality of preamplifiers provided corresponding to the plurality of memory blocks for amplifying selected data, and a select unit for selecting in a hierarchy manner a plurality of output signals from the plurality of preamplifiers by first and second select circuits for outputting the same.

According to the above-described structure, a plurality of output signals of the preamplifiers can be selected in a hierarchy manner, so that a bit organization and a test mode can be switched to desired ones.

A semiconductor memory device according to a still further aspect of the present invention includes a memory cell array for storing data, a row decoder and a column decoder for selecting a predetermined data from the memory cell array, a preamplifier for amplifying data output from the memory cell array, a select unit responsive to a bit organization control signal for selecting data output from the preamplifier, a data bus for transmitting the data selected by the select circuit, and an output circuit for providing data transmitted by the data bus.

According to the above-described structure, data is selected prior to data being transferred to the data bus. Therefore, an unrequired data bus is not used. It is therefore possible to reduce the access time and the power consumption of the device.

According to yet a further aspect of the present invention, a semiconductor memory device includes a memory cell array for storing data, a row decoder and a column decoder for selecting a predetermined data from the memory cell array, a preamplifier for amplifying data provided from the memory cell array, a test result output circuit responsive to a test mode control signal for providing a predetermined test result according to the test organization on the basis of data output from the preamplifier, a data bus for transmitting the test result of the test circuit, and an output circuit for providing the test result transmitted by the data bus.

Of the above-described structure, a predetermined test result is output on the basis of data provided from the preamplifier prior to transmitting data to the data bus. Therefore, an unrequired data bus will not be used. Thus, the testing time and power consumption of the device at the time of testing are reduced.

A semiconductor memory device according to yet another aspect of the present invention includes a memory cell array for storing data, a row decoder and a column decoder for selecting a predetermined data from the memory cell array, a preamplifier for amplifying data output from the memory cell array, a select unit responsive to a bit organization control signal for selecting data provided from the preamplifier, a test result output circuit responsive to a test mode control signal for providing a predetermined test result on the basis of data output from the preamplifier, a data bus for transmitting data selected by the select circuit or a test result provided from the test result output circuit, and an output circuit for providing the data or the test result transmitted by the data bus. The select unit provides to the data bus the selected data as two signals complementary to each other. The test result output circuit provides the test result to the data bus as signals of 2 bits.

According to the above-described structure, the select unit provides the selected data to the data bus as complementary signals. The test result output circuit provides the test result to the data bus as signals of 2 bits. Therefore, a plurality of information can be transmitted as the test result by a pair of signal lines of the data bus. The number of signal lines is reduced to realize increased in the integration density of the device.

A semiconductor memory device according to yet a still further aspect of the present invention includes a first test result output circuit for providing a test result by a plurality of pairs of first complementary signals, a second test result output circuit for providing a test result by one pair out of a plurality of pairs of second complementary signals identical in number to the plurality of pairs of the first complementary signals, and an output circuit receiving first and second complementary signals for providing a test result. The first test result output circuit responds to the test result to provide the plurality of pairs of first complementary signals at one of first and second potential levels. The second test result output circuit fixes, to one of the first and second potential level, the level of one signal of a pair of second complementary signals that does not output a test result out of the plurality of pairs of second complementary signals, and outputs the same.

According to the above-described structure, the second test result output circuit fixes the potential level of one signal of a pair of second complementary signals that do not provide the test result to a potential equal to one of the first and second potentials of the first complementary signal of the first test result output circuit, and outputs the same. Therefore, both the first and second test result output circuits can fix one of the complementary signals to a predetermined potential for output.

Thus, the circuit complexity of the first and second test result output circuits can be reduced to increase the integration density of the device. Furthermore, power consumption of the device can be reduced because the charge/discharge current of the data bus is reduced.

A semiconductor memory device according to yet a still further aspect of the present invention includes a plurality of blocks disposed in a divided manner, each having a memory cell array, a row decoder, and a column decoder, and an address signal output circuit for providing to the row decoder and the column decoder an address signal for selecting a predetermined memory cell from the memory cell array. The address signal output circuit is disposed to be equal in distance from each of the plurality of blocks.

According to the above-described structure, the address signal output circuit is located at a distance substantially equal to the plurality of blocks, so that an address signal can be transmitted to each memory cell array at substantially the same transmission time period.

Therefore, the time required for transmitting an address signal to the plurality of blocks from the address signal output circuit can be reduced to increase the speed of the device.

A semiconductor memory device according to another aspect of the present invention includes a plurality of blocks disposed in a divided manner, each having a memory cell array, a row decoder, and a column decoder, an address signal input circuit for receiving an address signal, and a data input/output circuit for carrying out data input and output. The plurality of memory cell arrays are divided into a first region and a second region. The address signal input circuit is disposed between the plurality of memory cell arrays in the first region. The data input/output circuit is disposed between the plurality of memory cell arrays in the second region.

According to the above-described structure, the address signal input circuit and the data input/output circuit are disposed in the first region and the second region, respectively, so that a signal line of the address signal input circuit and the signal line of the data input/output circuit can be disposed so that they will not overlie each other. Therefore, the layout is simplified to realize increase in the integration density of the device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of a semiconductor memory device according to the present invention will be described hereinafter with reference to the drawings.

Figure 1:
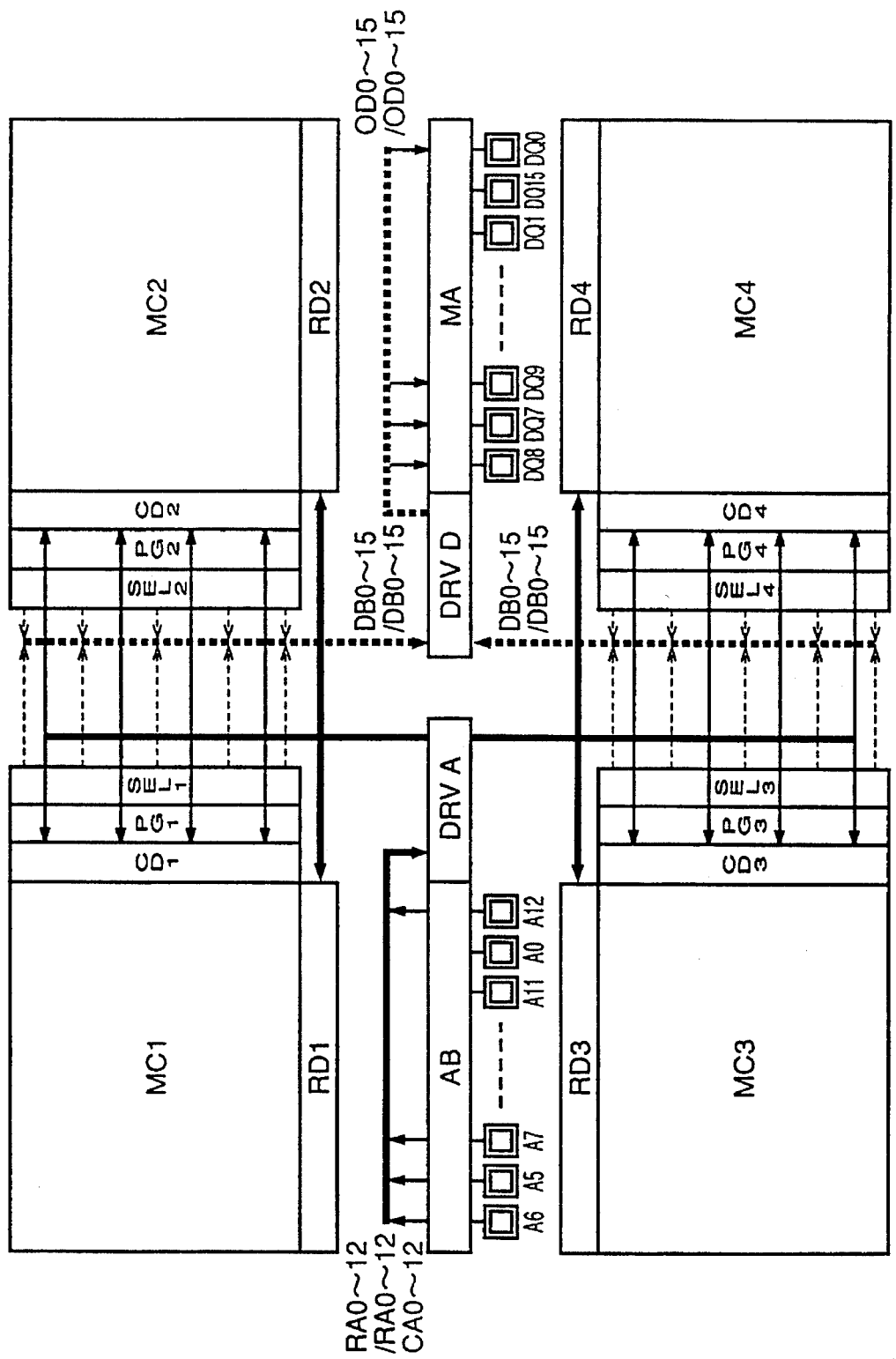
FIG. 1 is a block diagram showing a structure of a semiconductor memory device according to an embodiment of the present invention.

FIG. 1 is a block diagram showing a structure of a semiconductor memory device which is a 64M bit DRAM (Dynamic Random Access memory) according to an embodiment of the present invention.

Referring to FIG. 1, a semiconductor memory device includes memory cell arrays MC1–MC4, column decoders CD1–CD4, preamplifier groups PG1–PG4, row decoders RD1–RD4, an address input circuit AB, an address control circuit DRVA, a read data drive circuit DRVD, a data output circuit MA, address signal lines RA0–RA12, /RA0–/RA12, CA0–CA12, data output signal lines OD0–OD15, /OD0–/OD15, data buses DB0–DB15, /DB0–/DB15, address pads A0–A12, and input/output pads DQ0–DQ15.

Memory cell arrays MC1–MC4 each has a storage capacity of 16M bit and are disposed in 4 regions. An external address signal applied from address pads A0–A12 is provided to address input circuit AB. Address input circuit AB generates an internal address signal which is provided to address control circuit DRVA. Address signal circuit DRVA provides the internal address signal to row decoders RD1–RD4 and column decoders CD1–CD4. Row decoders RD1–RD4 and column decoders CD1–CD4 respond to the input internal address signal to select a predetermined memory cell from memory cell arrays MC1–MC4, whereby data is read out from that memory cell. The data read out from the memory cell is amplified by preamplifiers PA1–PA4. The amplified data is selected or a test result created according to the bit organization or the test mode at selector units SEL1–SEL4. The selected data or test result is applied to read data drive circuit DRVD via data buses DB0–DB15, /DB0–/DB15. Read data drive circuit DRVD selects data or produces a test result according to the bit organization or the test mode to provide the same to data output circuit MA via data output signal lines OD0–OD15, /OD0–/OD15. Data output circuit MA provides the output data or the test result to input/output pads DQ0–DQ15.

The arrangement of each block will be described. Memory cell arrays MC1–MC4 are divided into 4 regions of 2 rows and 2 columns. Address control circuit DRVA is arranged substantially at the center of the four memory cell arrays MC1–MC4. The distance between address control circuit DRVA and each of memory cell arrays MC1–MC4 is substantially equal, so that the delay time of an internal address signal provided from address control circuit DRVA is substantially equal. As a result, the skew of the internal address signal is reduced, and the distance over which an internal address signal is to be transmitted is shortened. This reduces the access time to realize increase in the operation speed of the device.

Address pads A0–A12 and address input circuit AB are disposed between memory cell arrays MC1 and MC3 at the left side of FIG. 1. Input/output pads DQ0–OQ15 and data output circuit MA are disposed between memory cell arrays MC2 and MC4 at the right side of FIG. 1. Because the plurality of address signal lines RA0–RA12, /RA0–/RA12, CA0–CA12 (in the present embodiment, 36 lines) connected to address input circuit AB and the plurality of data output signal lines OD–OD15, /OD0–/OD15 (in the present embodiment, 32 lines) connected to data output circuit MA are disposed so as not to overlie each other, the pattern of each interconnection is simplified to allow reduction in the chip area. Therefore, the integration density of the device can be increased. Furthermore, because the lead frame extends up to the center of the chip in a semiconductor memory device of a LOC (Lead On Chip) structure, bonding between each pad and the lead frame can be facilitated by disposing each pad as described above.

In the semiconductor device of the present embodiment, the input/output unit of data, i.e, the bit organization, can be selected arbitrarily of a x1 bit organization (for example, nibble mode), a x4 bit organization, a x8 bit organization or a x16 bit organization by bonding. The present embodiment employs the bit organization of x1, x4, x8, and x16 to match the most prevalent demands of the semiconductor market and because their outer dimension are substantially the same. This similarity in the outer configuration means that the same chip size limitation prevails, and the productivity can be improved by obtaining a plurality of bit configurations with one chip.

The semiconductor device of the present embodiment includes a test mode in which match/mismatch of data is tested according to each bit organization. This test mode includes a general test mode where the test result is generally output to one input/output pad, and an independent test mode where the test result is output independently according to the test organization.

A switch circuit for carrying out selection of the above-described bit organization and test mode by wire bonding will be described hereinafter with reference to FIG. 2.

Figure 2:
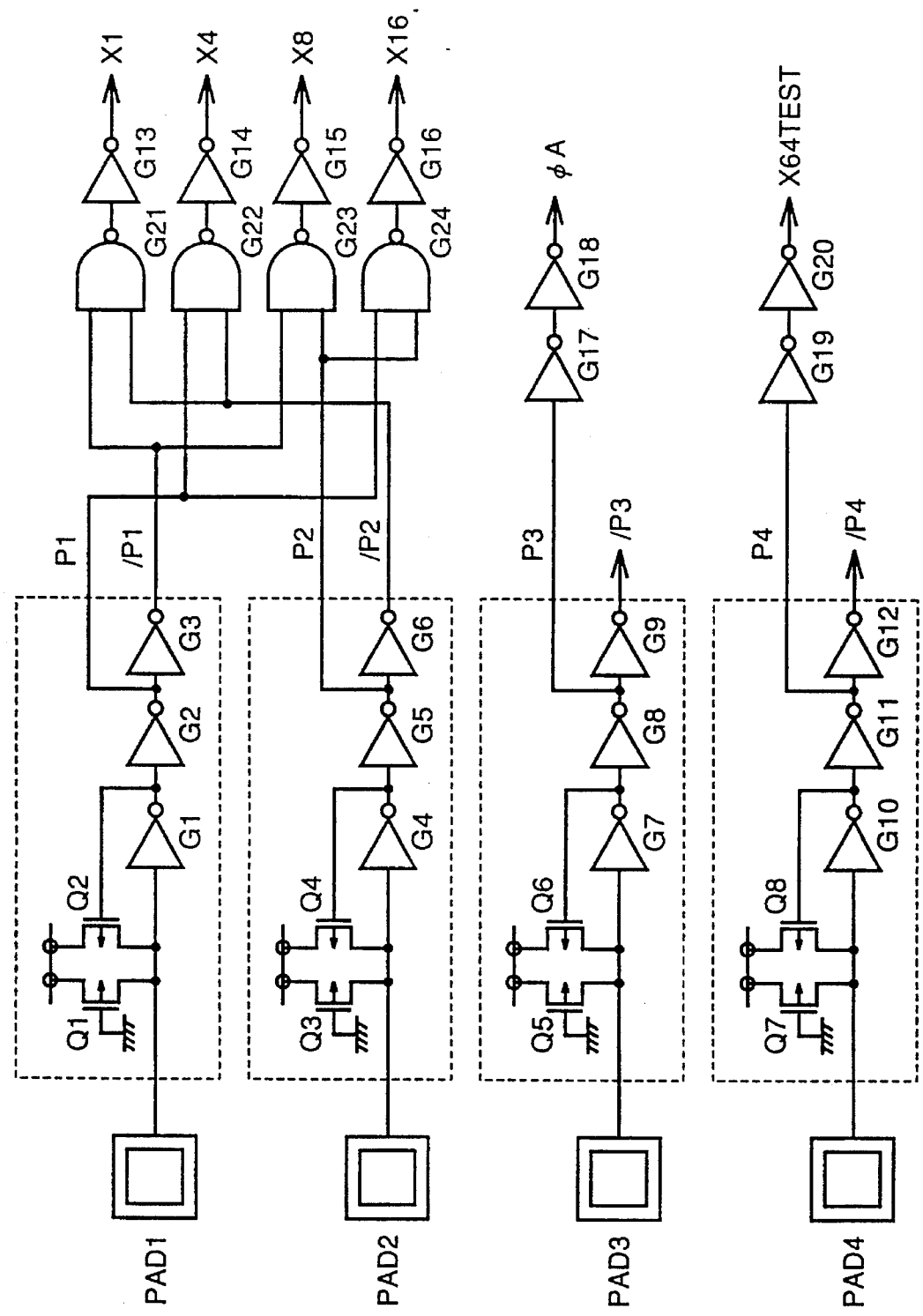
FIG. 2 is a circuit diagram showing a structure of a switch circuit of a semiconductor memory device according to an embodiment of the present invention.

Referring to FIG. 2, a switch circuit by wire bonding includes bonding pads PAD1–PAD4, transistors Q1–Q8, inverters G1–G20, and NAND gates G21–G24.

When bonding pads PAD1–PAD4 are not bonded, output signals P1–P4 attain a H level and output signals /P1–/P4 attain a L level. When bonding pads PAD1–PAD4 are connected to ground potential, output signals P1–P4 attain a L level, and output signals /P1–/P4 attain a H level. Selection of the bit organization and test mode can be carried out by connecting bonding pads PAD1–PAD4 as set forth in the following. In a x1 bit organization, bonding pads PAD1 and PAD2 are connected to ground potential. Output signals /P1 and /P2 both attain a H level, whereby a x1 bit organization select signal x1 attains a H level. When a 4 bit organization is to be selected, only bonding pad PAD2 is connected to ground potential, whereby output signals P1 and /P2 attain a H level. Therefore, a x4 bit organization select signal x4 attains H level. Similarly, in a x8 bit organization, only bonding pad PAD1 is connected to ground potential, whereby x8 bit organization select signal x8 attains a H level. In a x16 bit organization, both bonding pads PAD1 and PAD2 are not connected, so that a x16 bit organization select signal x16 attains a H level. The bonding pads are wired in a similar manner for a general test mode signal φA and a 64 bit parallel signal x64TEST. More specifically, when bonding pads PAD3 and PAD4 are not connected, general test mode signal φA and 64 bit parallel signal x64TEST attain a H level. When bonding pads PAD3 and PAD4 are connected to ground potential, general test mode signal φA and 64 bit parallel signal x64TEST attain a L level.

Because the above-described switch circuit serves only to output a signal of a constant level, the transfer speed of the signal is not important. Therefore, this switch circuit may be disposed anywhere in the semiconductor memory device of FIG. 1. For example, the above-described switch circuit may be disposed at the outer side of address pads A0–A12, or at the outer side of input/output pads DQ0–OQ15, or may be located in both places, since it includes bonding pads.

Figure 3:
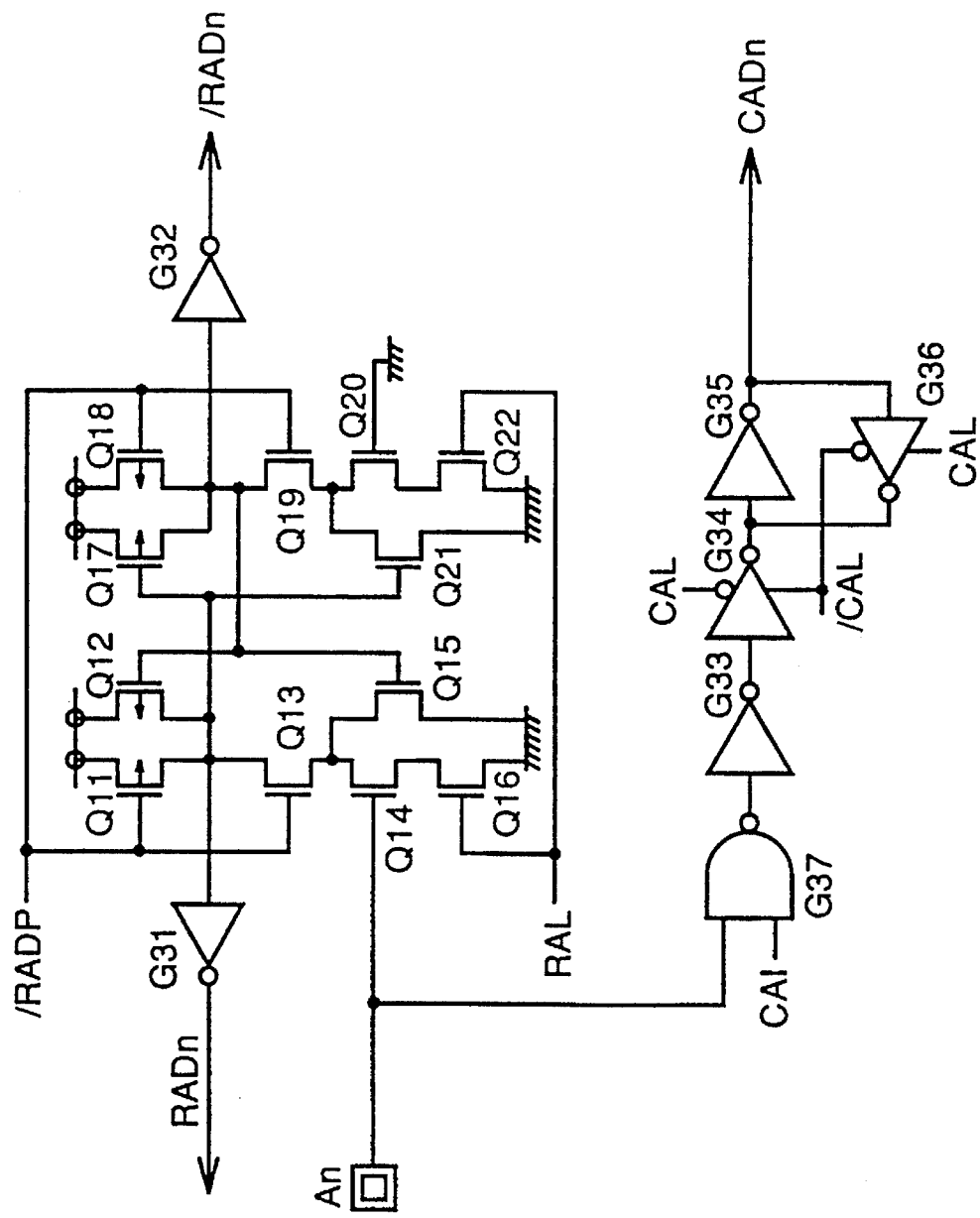
FIG. 3 is a circuit diagram showing a structure of the address input circuit of FIG. 1.

An example of the address input circuit of FIG. 1 will be described hereinafter with reference to FIG. 3 showing a structure thereof.

Referring to FIG. 3, an address input circuit includes transistors Q11–Q22, inverters G31–G36, and an NAND gate G37.

The address input circuit shown in FIG. 3 corresponds to one address pad An. The address input circuit AB shown in FIG. 1 includes an address input circuit of FIG. 3 corresponding to respective address pads.

The address input circuit responds to internally generated control signals /RADP and RAL to generate internal row address signals RADn and /RADn according to address pad An. Address input circuit also responds to a control signal CAI to generate an internal column address signal CADn. The address input circuit is disposed in the proximity of address pads A0–A12 to reduce the delay time of an external address signal.

Figure 4:
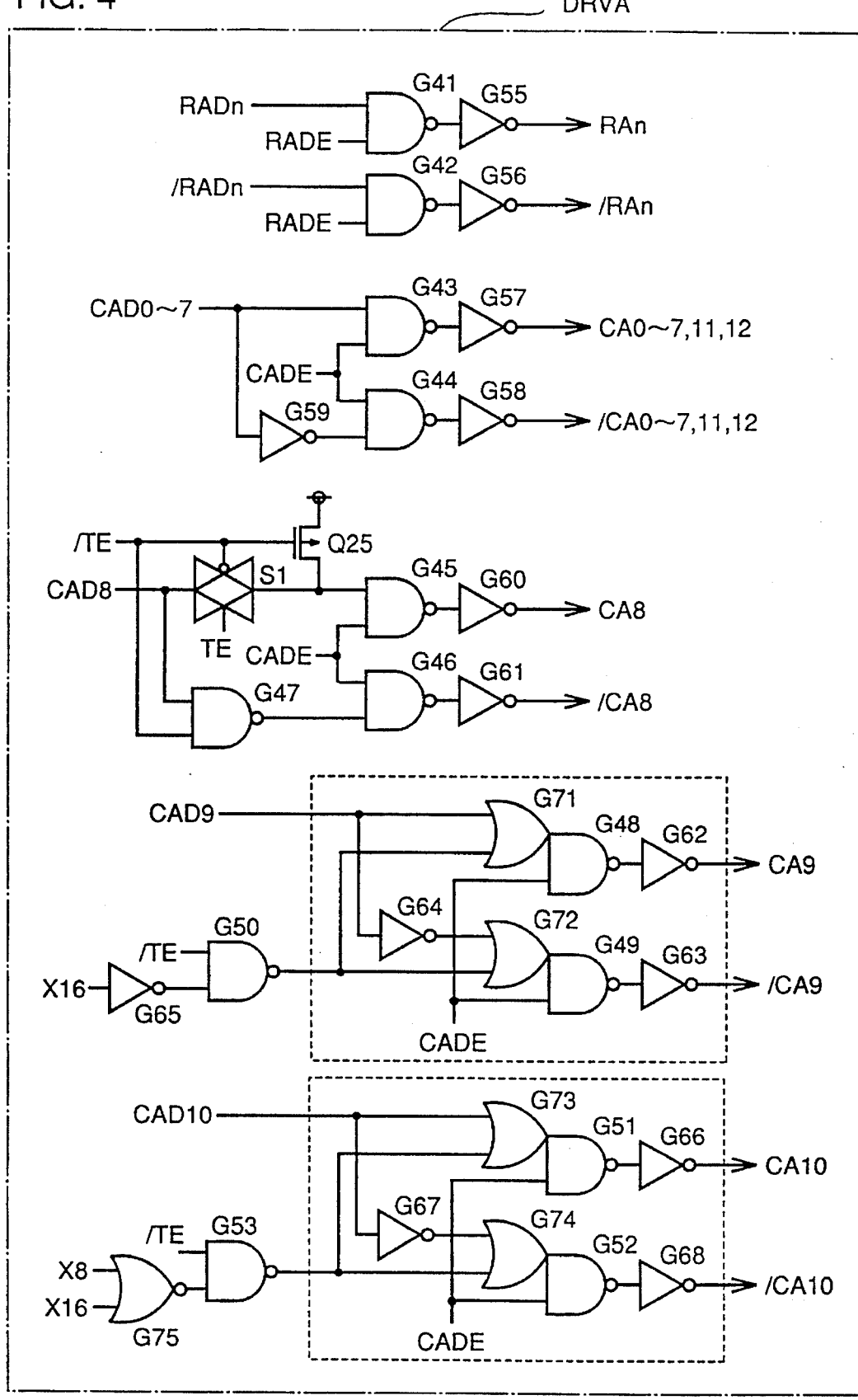
FIG. 4 is a circuit diagram showing a structure of the address control circuit of FIG. 1.

An example of the address control circuit of FIG. 1 will be described hereinafter with reference to FIG. 4 showing a structure thereof.

Referring to FIG. 4, an address control circuit includes NAND gates G41–G53, inverters G55–G68, OR gates G71–G74, an NOR gate G75, a switch S1, and a transistor Q25.

Internal control signals RADE and CADE serve to control the generation timing of internal row address signal RAn and internal column address signal CAn. More specifically, when internal control signals RADE and CADE attain a H level, internal row address signal RAn and internal column address signal CAn are generated according to the external address signal. When internal control signals RADE and CADE attain a L level, internal row address signals RAn, /RAn and internal column address signals CAn, /CAn all attain a L level. Internal column address signals CA8 and /CA8 both attain a H level when test mode signal /TE is rendered to "L". Internal column address signals CA9 and /CA9 both attain a H level in a test mode and a x16 bit organization. Internal column address signals CA10 and /CA10 both attain a H level when in a test mode and under the organization of x16 bits and x8 bits.

Two sets of the address control circuit shown in FIG. 4 are provided in order to provide respective internal row address signals and internal column address signals to the upper and lower row decoders RD1–RD4 and column decoders CD–CD4. Selection of operating either the upper or lower address control circuit is controlled by providing internal control signals RADE and CADE only to one of the address control circuits. Here, internal control signals RADE and CADE are generated depending on external row address strobe signal /RAS and external column address strobe signal /CAS to determine the generation timing of a row address and a column address. Test mode signals TE and /TE indicate a test mode. In a general operation mode, test mode signals TE and /TE attain a L level and a H level, respectively. In a test mode, test mode signals TE and /TE attain a H level and a L level, respectively. A test mode is entered when external column address strobe signal /CAS and external write enable signal /WE both attain a L level at the rise of external row address strobe signal /RAS.

In a x16 bit organization, internal column address signals CA10 and CA9 are not used. Therefore, in a normal operation mode, internal column address signals CA9, /CA9, CA10, and /CA10 are fixed to a H level. Similarly in a x8 bit organization, internal column address signals CA10 and /CA10 are both fixed to a H level. In a test mode, the states of internal column address signals CA8, CA9 and CA10 do not affect the operation of the device, so that internal column address signals CA8, /CA8, CA9, /CA9, CA10 and /CA10 attain a H level. Thus, determination of which address signal is to be used for a test mode depends on the specification of the semiconductor product.

Figure 5:
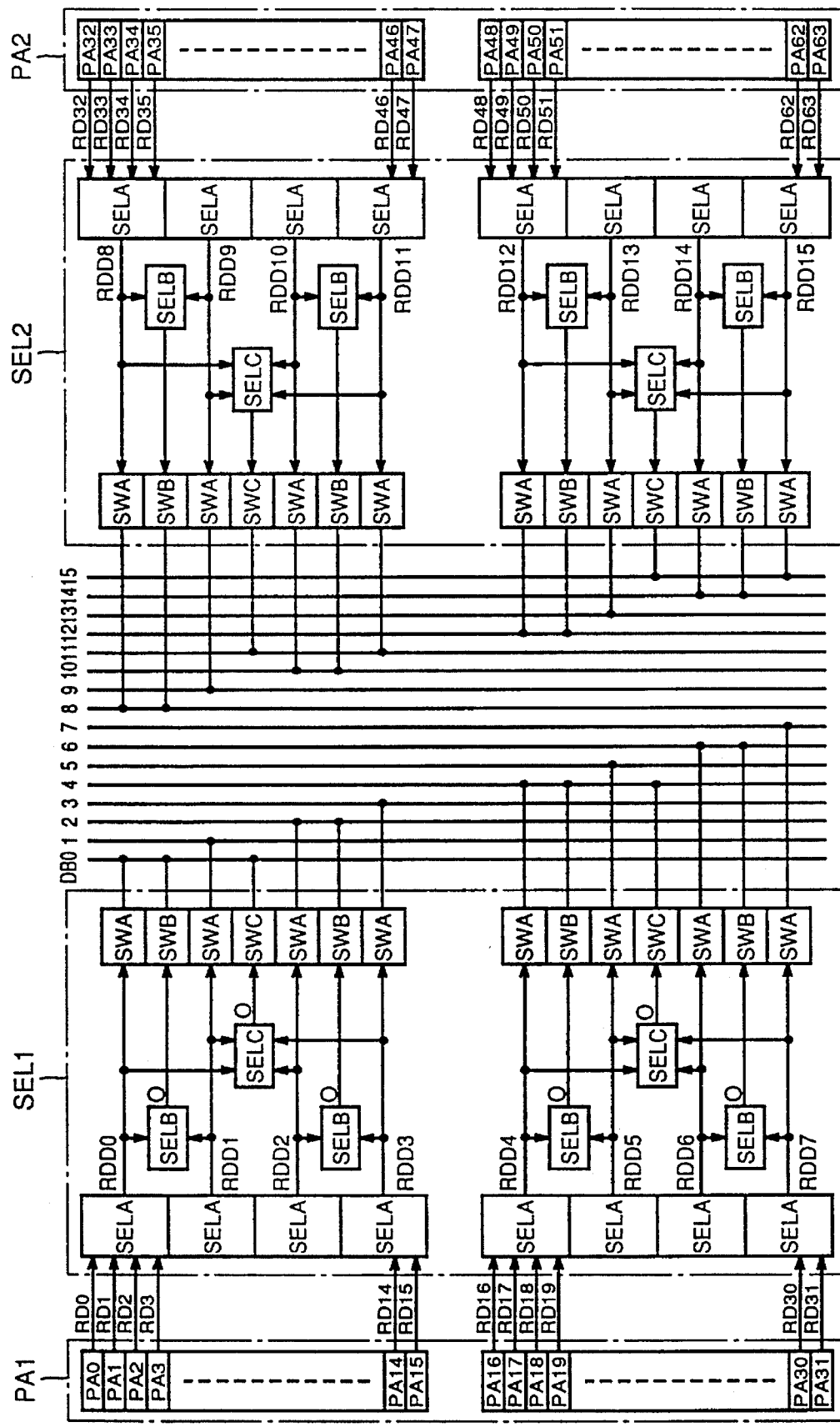
FIG. 5 is a block diagram showing a structure of the selector unit of FIG. 1.

The selector unit of FIG. 1 will be described hereinafter with reference to the block diagram of FIG. 5 showing a structure thereof. All the signal lines in FIG. 5 are complementary signal lines.

Referring to FIG. 5, a selector unit SEL1 includes first, second, and third selectors SELA, SELB, and SELC, and first, second and third switches SWA, SWB, and SWC.

Each data read out from a predetermined memory cell out of the plurality of memory cells connected to a common word line is amplified by a corresponding one of preamplifiers PA0–PA63. In a normal read out operation, data from 16 preamplifiers PA0, PA4, PA8, PA12, PA16, ..., PA60 of the 64 preamplifiers PA0–PA63 are simultaneously output. In a 32 bit parallel test mode, data from 16 preamplifiers PA2, PA6, PA10, ... PA62 are further read out. In a 64-bit parallel test mode, data from all the 64 preamplifiers PA0–PA60 are read out. The output signals of 64 preamplifiers PA0–PA63 are applied by every 4 output signals into first selector SELA. First selector SELA selects a predetermined data from the 4 input data. The selected data is provided to second and third selectors SELB and SELC, and first switch SWA. First selector SELA makes determination of the match/mismatch of the 4 input data to provide the determination result to first switch SWA and second and third selectors SELB and SELC.

Second selector SELB selects a predetermined data out of the 2 data provided from first selector SELA. The selected data is provided to second switch SWB. Second selector SELB also makes determination of the match/mismatch of the 2 data provided from first selector SELA. The determination result is provided to second switch SWB.

Third selector SELC selects a predetermined data from the 4 data provided from first selector SELA. The selected data is provided to third switch SWC. Third selector SELC also carries out determination of the match/mismatch of the 4 data provided from first selector SELA. The determination result is provided to third switch SWC.

First, second and third switches SWA, SWB and SWC are respectively connected to a predetermined data bus out of data buses DB0–OB15. The input data or determination result is provided to data buses DB0–OB15.

Figure 6:
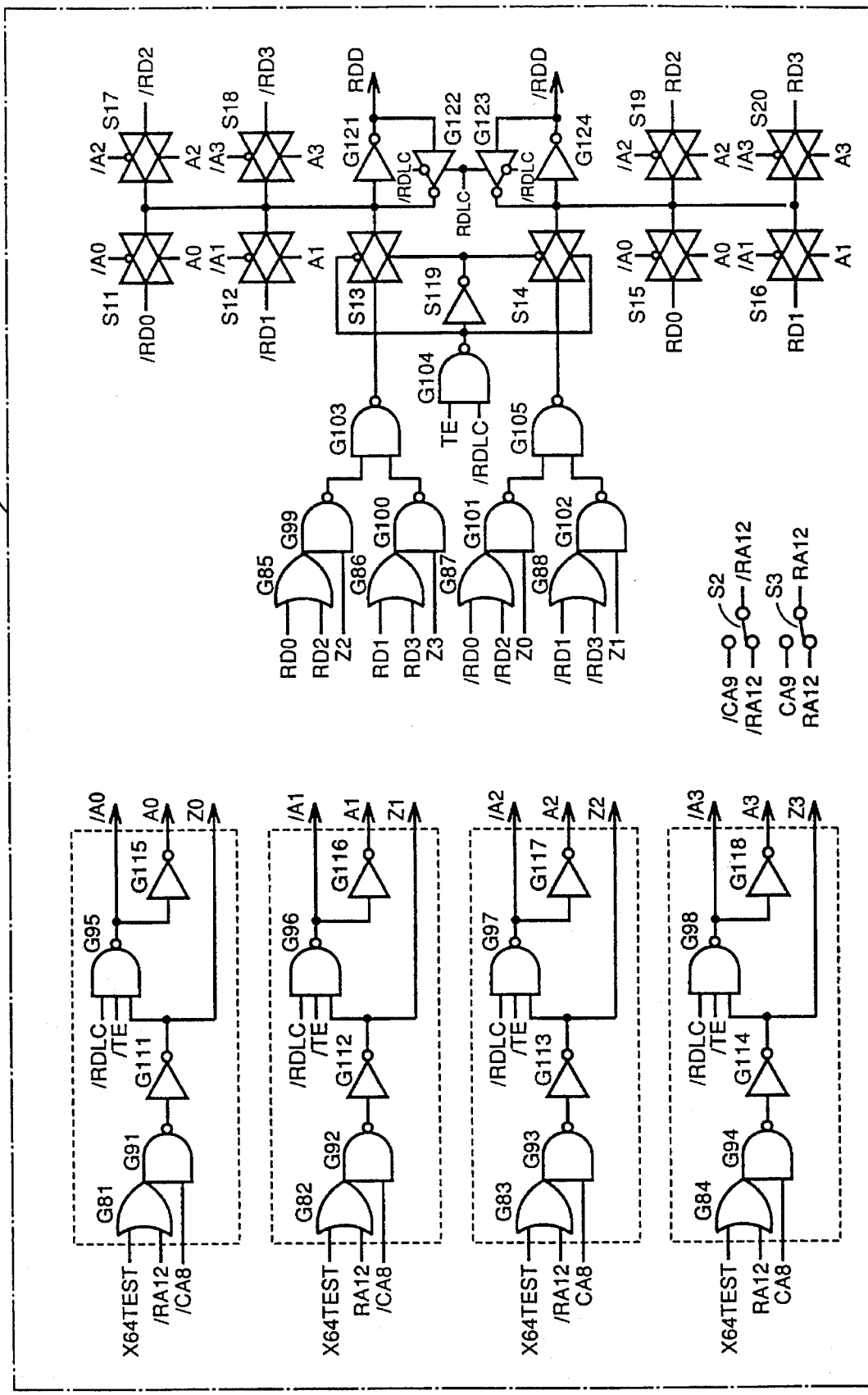
FIG. 6 is a circuit diagram showing a structure of the first selector of FIG. 5.

The first selector shown in FIG. 5 will be described with reference to FIG. 6 showing a detailed structure thereof.

Referring to FIG. 6, a first selector includes OR gates G81–G88, NAND gates G91–G105, inverters G111–G124, and switches S2, S3, S11–S20.

Internal address signals RA12 and CA8, test mode signal TE, and 64-bit parallel test signal x64TEST are provided to the first selector. In a normal read out operation, one of the four output signals RD0–RD3 of the four preamplifiers is selected and output by internal address signals RA12 and CA8. In a test mode, test mode signal TE attains a H level, and internal address signals CA8 and /CA8 are output at a H level by the address control circuit shown in FIG. 4. Therefore, when internal address signal RA12 attains a L level, output signals Z0 and Z2 both attain a H level, whereby the comparison result of output signal RD0 with output signal RD2 of the preamplifiers and the comparison result of output signal /RD0 with output signal /RD2 are provided as output signals RDD and /RDD, respectively, of the first selector. More specifically, when output signals RD0 and RD2 of the preamplifiers both attain a H level, the output signal RDD of the first selector attains a L level, and complementary signal /RDD attains a H level. When output signals RD0 and RD2 both attain a L level, output signal RDD attains a H level and complementary signal /RDD attains a L level. Otherwise, output signals RDD and /RDD of the first selector both attain a L level.

When a 64 bit parallel test is to be carried out as a test mode, 64-bit parallel test signal x64TEST attains a H level. This causes output signals Z0–Z3 of inverters G111–G114 to attain a H level regardless of the state of internal address signal RA12. Therefore, the comparison results of the 4 bits of output signals RD0–RD3 and /RD0–/RD3 of the preamplifiers are provided as output signals RDD and /RDD, respectively, of the first selector. More specifically, when output signals RD0–RD3 of the preamplifiers attain a H level, output signals RDD and /RDD attain a L level and a H level, respectively. When all output signals RD0–RD3 of the preamplifiers attain a L level, output signals RDD and /RDD attain a H level and a L level, respectively. Otherwise, output signals RDD and /RDD both attain a L level.

Figure 7:
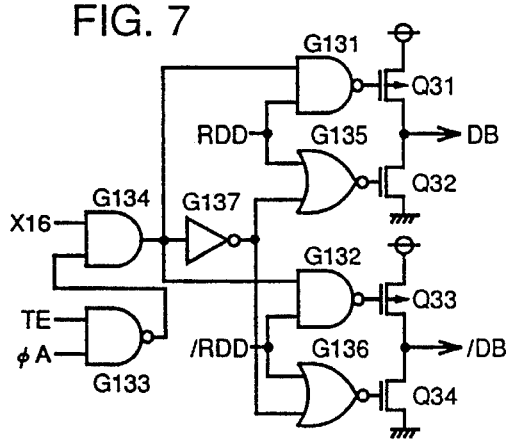
FIG. 7 is a circuit diagram showing a structure of the first switch of FIG. 5.

The first switch shown in FIG. 5 will be described in detail with reference to FIG. 7 showing a structure thereof.

Referring to FIG. 7, a first switch includes NAND gates G131–G133, an AND gate G134, NOR gates G135 and G136, an inverter G137 and transistors Q31–Q34.

A x16 bit organization select signal x16 indicating a x16 bit organization is applied to the first switch. When x16 bit organization select signal x16 attains a H level, output signals RDD and /RDD from first selector are provided to data buses DB and /DB. Here, transistors Q31–Q34 providing signals to data buses DB and /DB can be driven at high speed even in the case of a long data bus by using transistors of great driving capability. In a x16 bit organization, output signals of the 16 first selectors are provided to respective corresponding 16 pairs of data buses to result in an output signal of 16 bits. In a bit organization other than 16 bits, the output signal of the first switch attains a high impedance state, whereby data output from the preamplifier is read out to a data bus via another selector SELB or SELC.

The second selector shown in FIG. 5 will be described in detail hereinafter with reference to FIG. 8.

Figure 8:
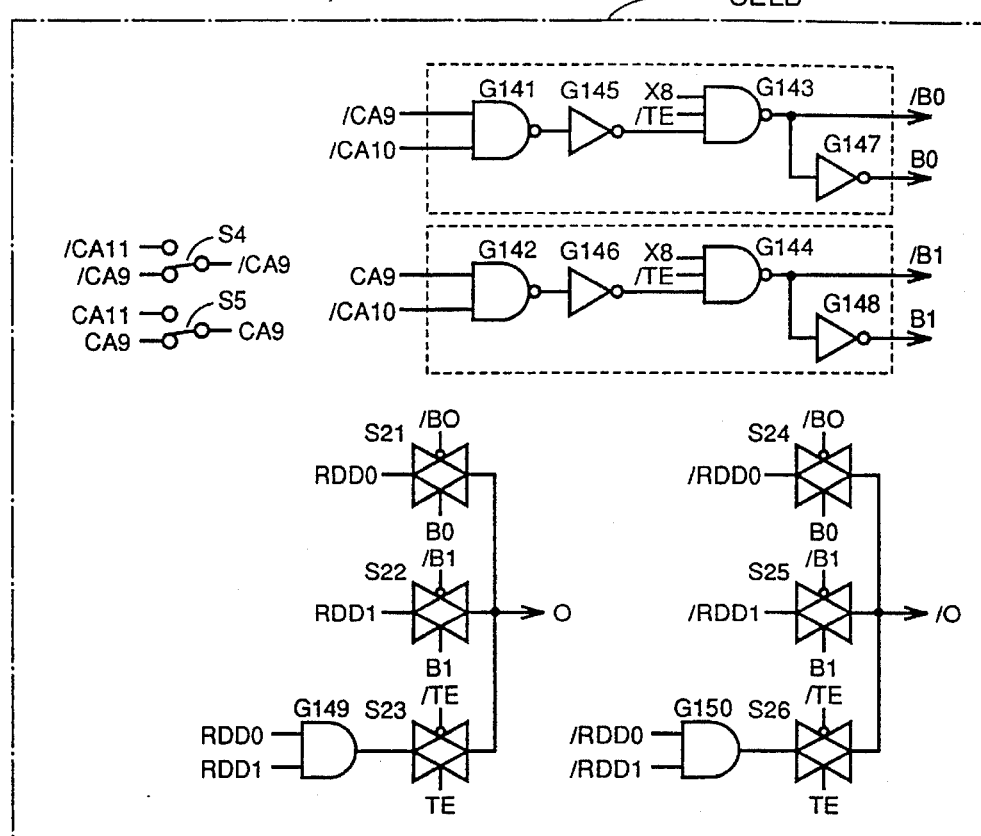
FIG. 8 is a circuit diagram showing a structure of the second selector of FIG. 5.

Referring to FIG. 8, a second selector includes NAND gates G141–G144, inverters G145–G147, AND gates G149 and G150, and switches S4, S5, and S21–S26.

Internal address signal CA9 and test mode signal TE are applied to the second selector. In a normal read out operation, one of the complementary signals RDD0, /RDD0, RDD1, and /RDD1 provided from the two first selectors is selected and output by internal address signal CA9. In test mode, test mode signal TE attains a H level, and the logic product of output signals RDD0 and RDD1 and the logic product of output signals /RDD0 and /RDD1 of the two first selectors are provided as output signals O and /O, respectively. When output signals RDD0 and RDD1 of the first selector both attain a H level, output signal O attains a H level and output signal /O attains a L level. When output signals RDD0 and RDD1 of the first selector both attain a L level, output signal O attains a L level and output signal /O attains a H level. Otherwise, output signals O and /O both attain a L level.

The second switch shown in FIG. 5 will be described in detail with reference to the circuit diagram of FIG. 9.

Figure 9:
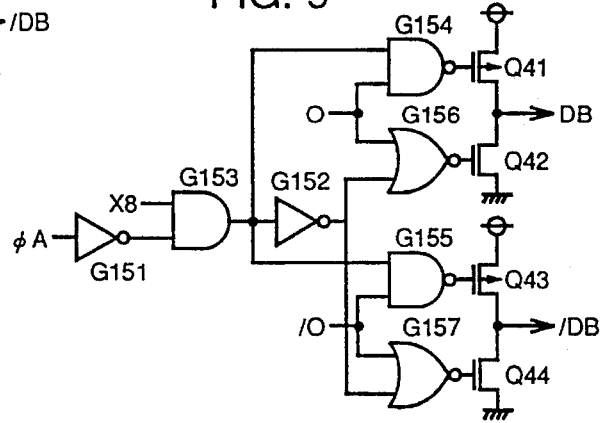
FIG. 9 is a circuit diagram showing a structure of the second switch of FIG. 5.

Referring to FIG. 9, a second switch includes inverters G151 and G152, an AND gate G153, NAND gates G154 and G155, an NOR gates G156 and G157, and transistors Q41–Q44.

A x8 bit organization select signal x8 indicating a x8 bit organization is applied to the second switch. In a x8 bit organization, x8 bit organization select signal x8 attains a H level, whereby output signals O and /O of the second selector are provided to data buses DB and /DB. In other bit organizations, the output signal of the second switch attains a high impedance state.

The third selector shown in FIG. 5 will be described in detail with reference to the circuit diagram of FIG. 10.

Figure 10:
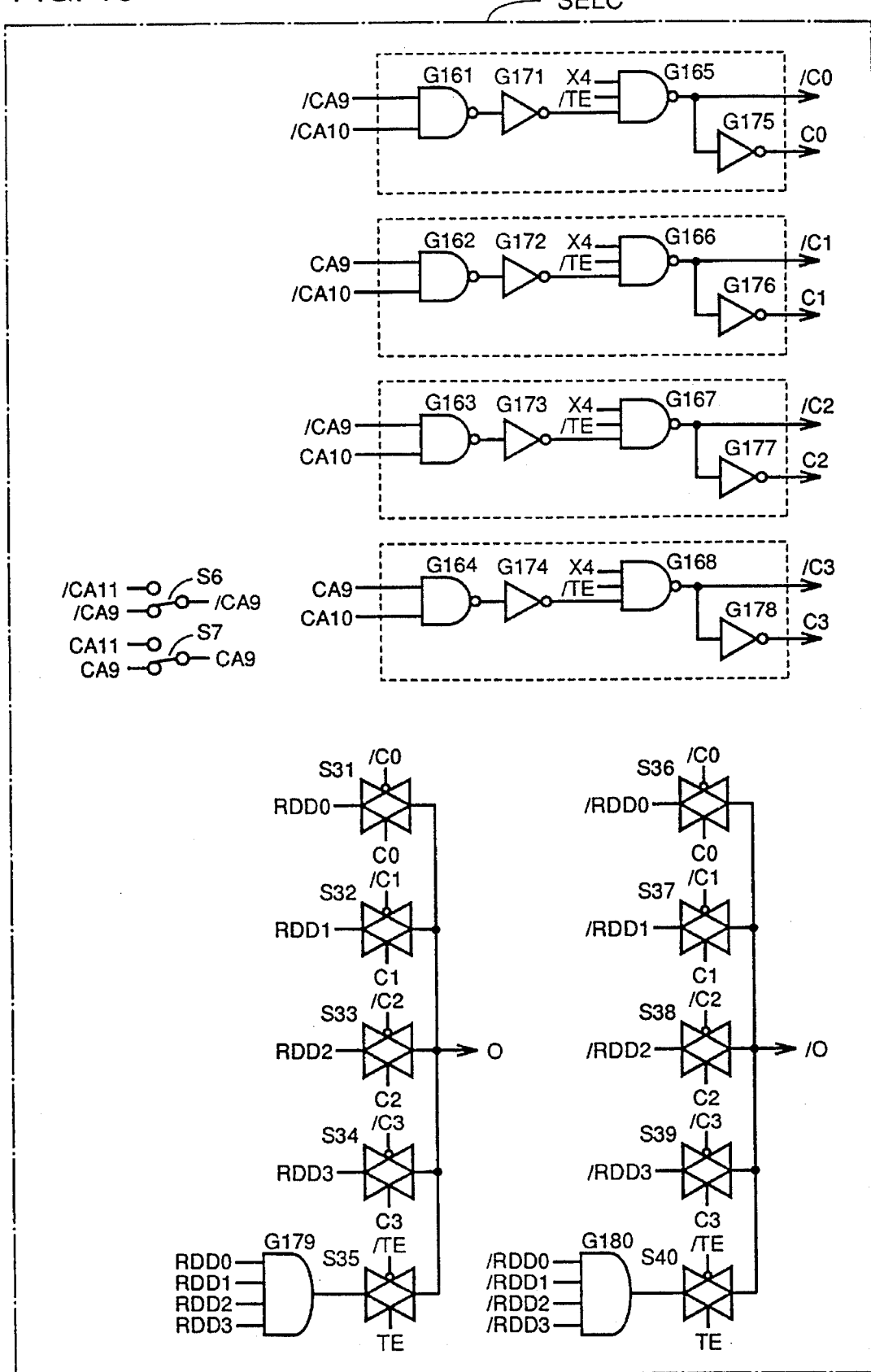
FIG. 10 is a circuit diagram showing a structure of the third selector of FIG. 5.

Referring to FIG. 10, a third selector includes NAND gates G161–G168, inverters G171–G178, 4-input AND gates G179 and G180, and switches S6, S7, S31–S40.

The operation of the third selector is basically similar to that of the second selector of FIG. 8. In a general read out operation, one of the four complementary signals provided from the first selector is selected and output by internal address signals CA9 and CA10. In a test mode, the logic product of the four output signals RDD0–RDD3 and the logic product of the four output signals /RDD0–/RDD3 of the 4 first selectors are output as output signals O and /O, respectively.

The third switch of FIG. 5 will be described in detail hereinafter with reference to the circuit diagram of FIG. 11.

Figure 11:
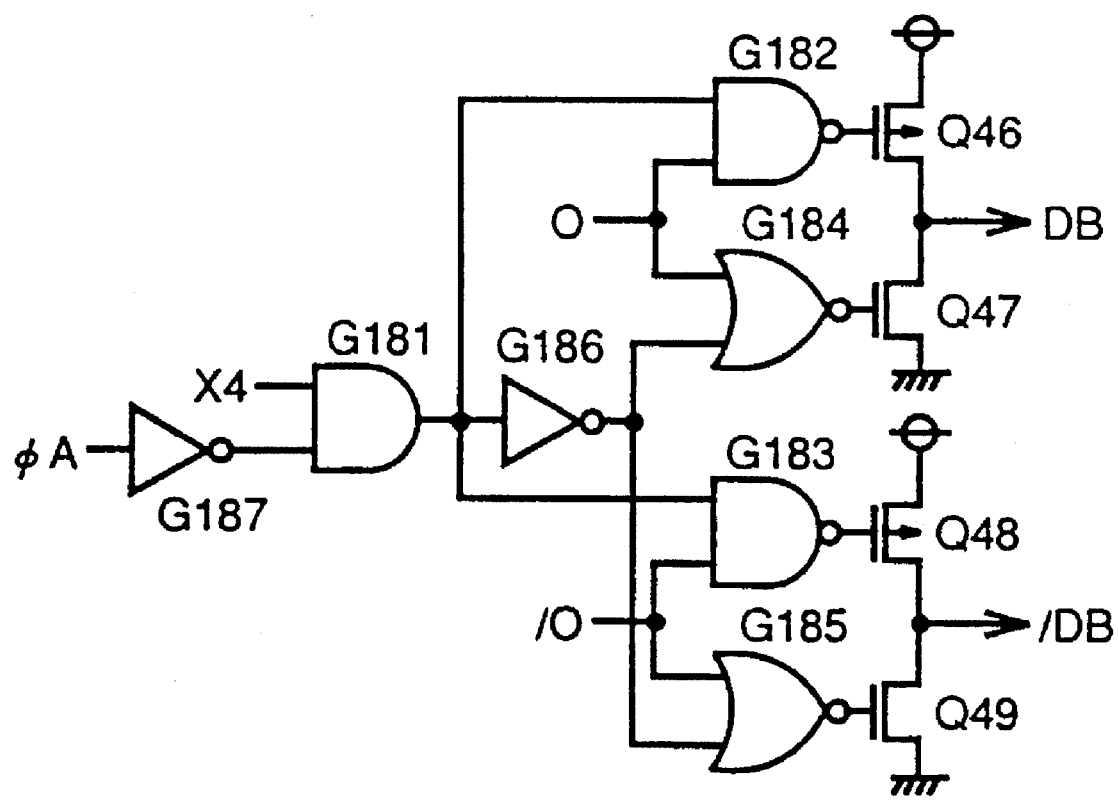
FIG. 11 is a circuit diagram showing a structure of the third switch of FIG. 5.

Referring to FIG. 11, a third switch includes an AND gate G181, NAND gates G182 and G183, NOR gates G184 and G185, inverters G186 and G187, and transistors Q46–Q49.

A x4 bit organization select signal x4 indicating a x4 bit organization is applied to the third switch. In a x4 bit organization, the x4 bit organization select signal attains a H level, and output signals O and /O of the third selector are provided to data buses DB and /DB. In other bit organizations, the output signal of the third switch attains a high impedance state.

The read data drive circuit shown in FIG. 1 will be described in detail with reference to the block diagram of FIG. 12.

Figure 12:
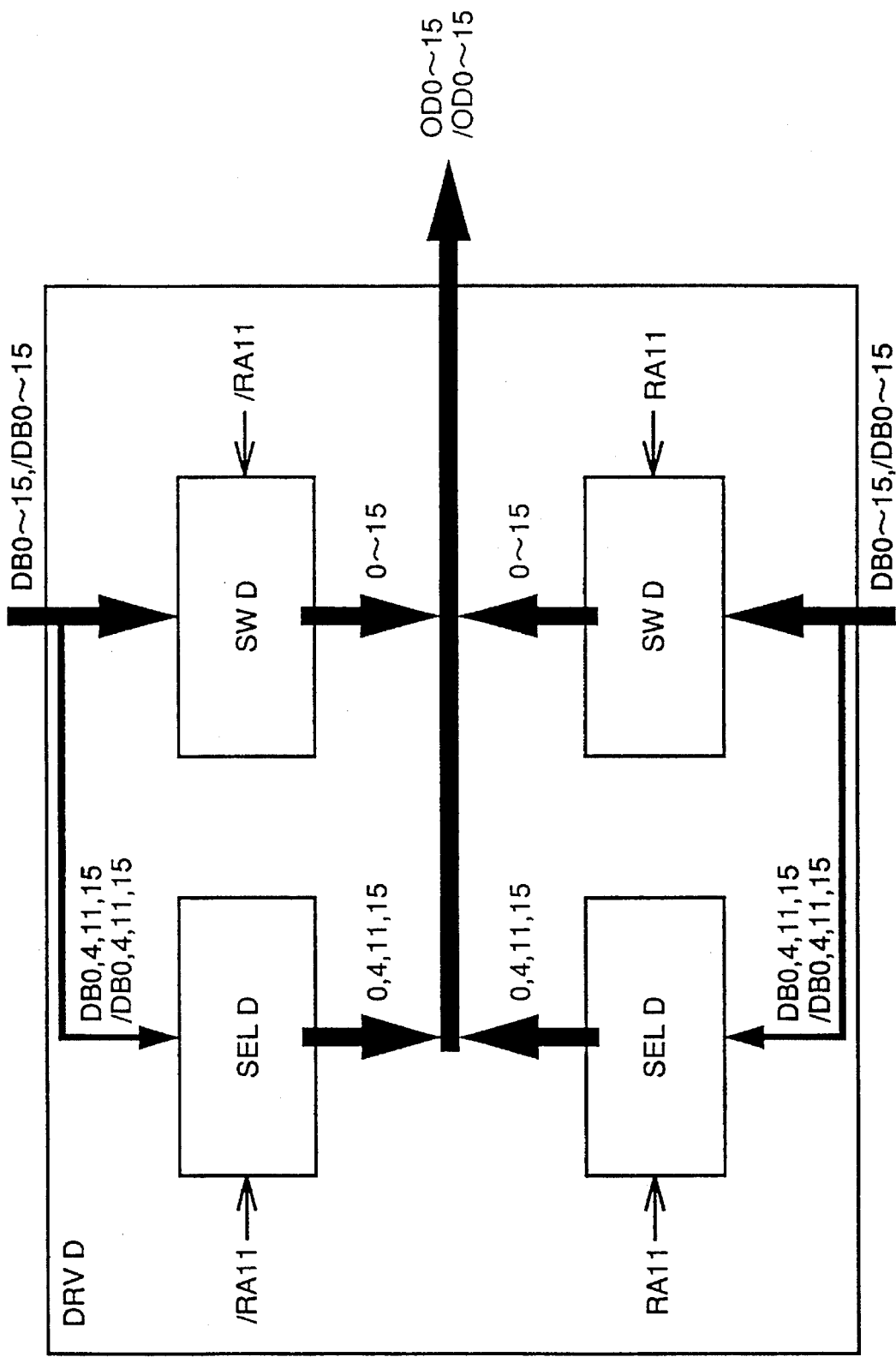
FIG. 12 is a block diagram showing a structure of the read data drive circuit of FIG. 1.

Referring to FIG. 12, a read data drive circuit includes a fourth selector SELD and a fourth switch SWD.

Upper and lower pairs of data buses DB0–OB15 and /DB0–/DB15 are connected to the read data drive circuit. One of the two pairs of data buses is selected by internal address signal RA11, whereby data of the selected data bus is provided to data output signal lines OD–OD15 and /OD0–/OD15.

The fourth selector SELD shown in FIG. 12 will be described in detail with reference to the circuit diagram of FIG. 13.

Figure 13:
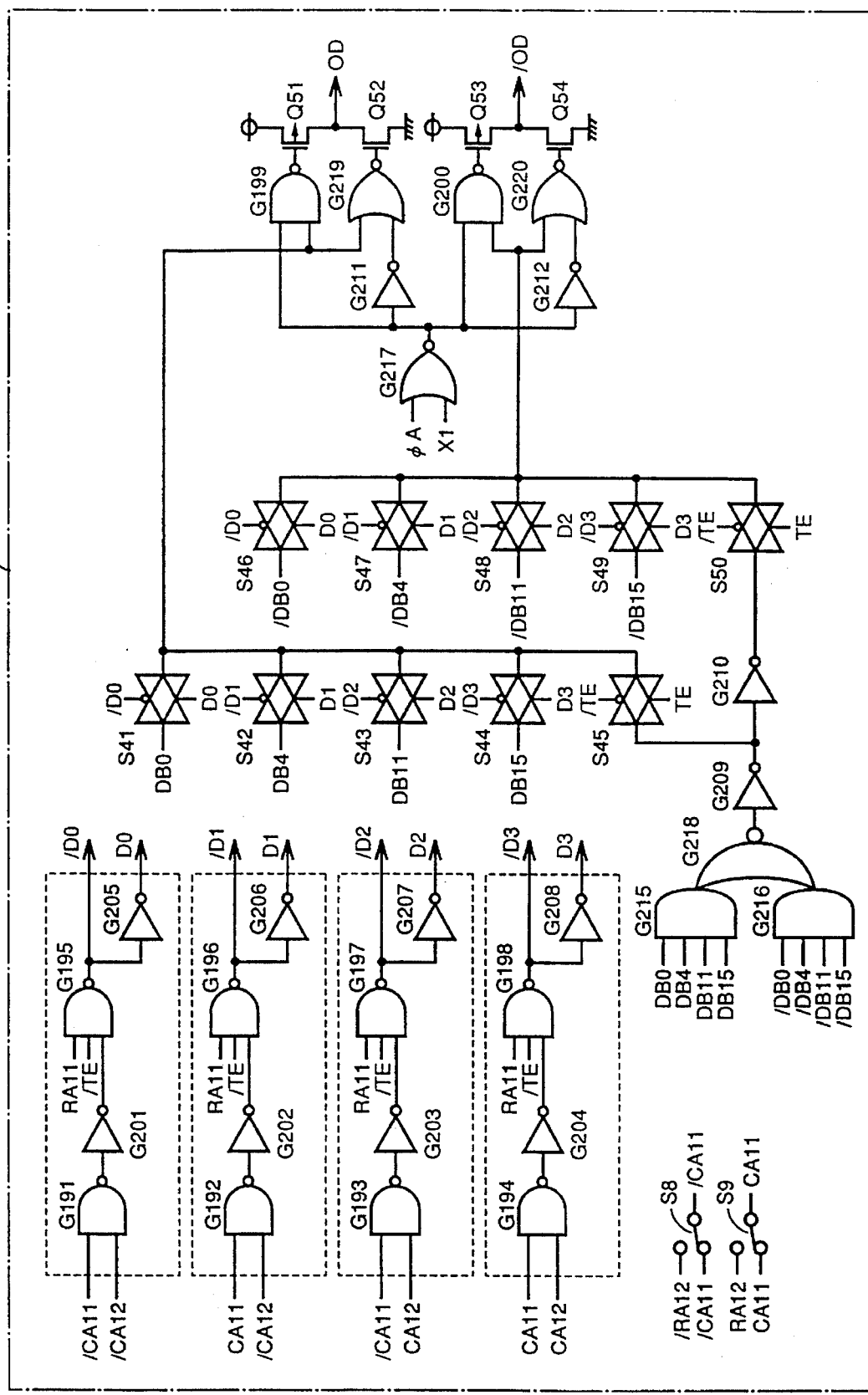
FIG. 13 is a circuit diagram showing a structure of the fourth selector of FIG. 12.

Referring to FIG. 13, a fourth selector includes NAND gates G191–G200, inverters G201–G212, 4-input AND gates G215 and G216, an OR gate G217, NOR gates G218–G220, transistors Q51–Q54, and switches S8, S9, S41–S50.

Four data from data buses DB0, /DB0, DB4, /DB4, DB11, /DB11, DB15 /DB15, internal address signals CA11, /CA11, CA12, /CA12, and a test mode signal /TE are provided to the fourth selector. In a general read out operation, one of the four data on data buses DB0, /DB0, DB4, /DB4, DB11, /DB11, DB15 and /DB15 is selected to be provided to data output signal lines OD and /OD by internal address signals CA11, /CA11, CA12, /CA12. In a test mode, the four data are applied to a comparison circuit of G215, G216, G218 and G209. When the 4 bits of data all match each other at a H level or a L level, output signals OD and /OD are provided at a H level and a L level, respectively. When at least one of the 4 bits of data differs, output signals OD and /OD attain a L level and a H level, respectively, to make determination of the match/mismatch of the data of 4 bits.

A x1 bit organization select signal x1 indicating a x1 bit organization is applied to OR gate G217 of the fourth selector. When x1 bit organization select signal x1 attains a H level, 1 bit of data is provided to the fourth selector.

The operation of the first, second and third selectors of the above-described structures will be described in a test mode.

There are two output methods in a test mode. One method is to output the determination result of the match/mismatch of all the tested data generally to one data pin. The other method is to output independently the determination result of each data pin corresponding to each bit organization. A 32-bit parallel testing is carried out as set forth in the following. In a x1 bit organization, there is only the case of output to one data pin. In a x4 bit organization, there is a general output method of providing the determination result of match/mismatch of all the 32 bits to the data output pin, and an independent output method of carrying out determination of match/mismatch for every 8 bits to provide the respective results to three data output pins. Similarly in a x8 bit organization and a x16 bit organization, there is a general output method of making determination of data of 32 bits in parallel, and an independent output method of carrying out data determination for every 4 bits or every 2 bits to output the determination result to each data output pin.

In the present embodiment, the data bus of the x1 bit organization is used in the general parallel testing under x4 bit organization, x8 bit organization and x16 bit organization. A general test mode signal φA applied to OR gate G217 which is located at the output stage of the fourth selector shown in FIG. 13 indicates a general parallel testing. When general test mode signal φA attains a H level, the fourth selector outputs the determination result of a general parallel test regardless of the bit organization.

In a test mode, output signals RDD and /RDD of the first selector attain a L level and a H level, respectively, when all the data provided from the preamplifiers attain a H level as shown in FIG. 6. Therefore, output signals O and /O of the third selector shown in FIG. 10 attain a L level and a H level, respectively. This causes output signals OD and /OD of the fourth selector shown in FIG. 13 to attain a H level and a L level, respectively. In contrast, when all the data attain a L level, output signals RDD and /RDD of the first selector attain a H level and a L level, respectively. Therefore, output signals O and /O of the third selector attain a H level and a L level, respectively, whereby output signals OD and /OD of the fourth selector attain a H level and a L level, respectively.

When at least one bit of data provided from the preamplifiers differs from the other data, one pair of output signals RDD and /RDD out of the plurality of pairs of output signals RDD and /RDD from the plurality of selectors both attain a L level. This causes output signals O and /O of the third selector to attain a L level, whereby output signals OD and /OD of the fourth selector attain a L level and a H level, respectively.

According to the above-described operation, when all the data match each other in a general test mode, output signals OD and /OD of the fourth selector attain a H level and a L level, respectively. If determination is made of a mismatch where there is at least one different bit of data, output signals OD and /OD of the fourth selector attain a L level and a H level, respectively.

The fourth switch shown in FIG. 12 will be described in detail with reference to the circuit diagram of FIGS. 14–16.

Figure 14:
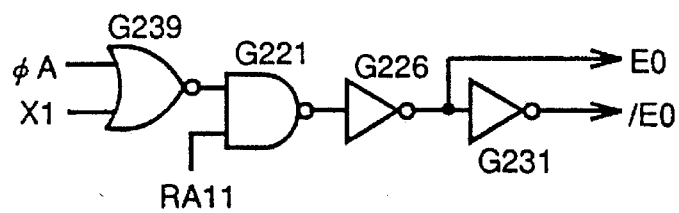
FIG. 14 is a first circuit diagram showing a structure of the fourth switch of FIG. 1.
Figure 14:
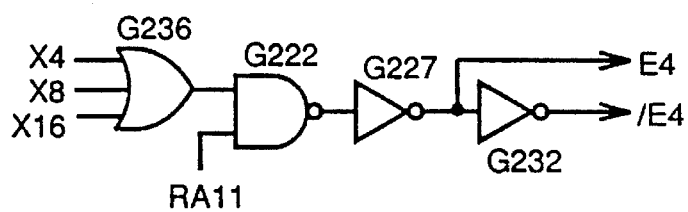
Figure 14:
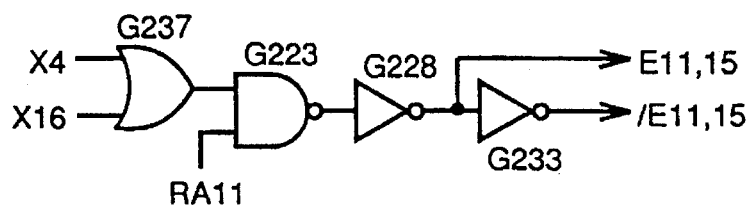
Figure 14:
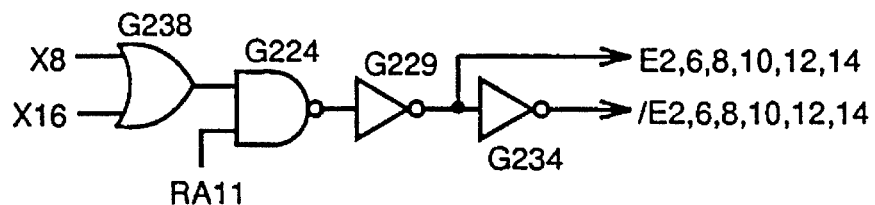
Figure 14:
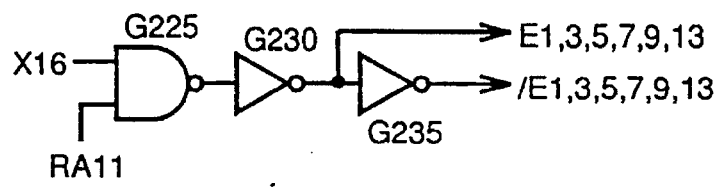
Figure 15:
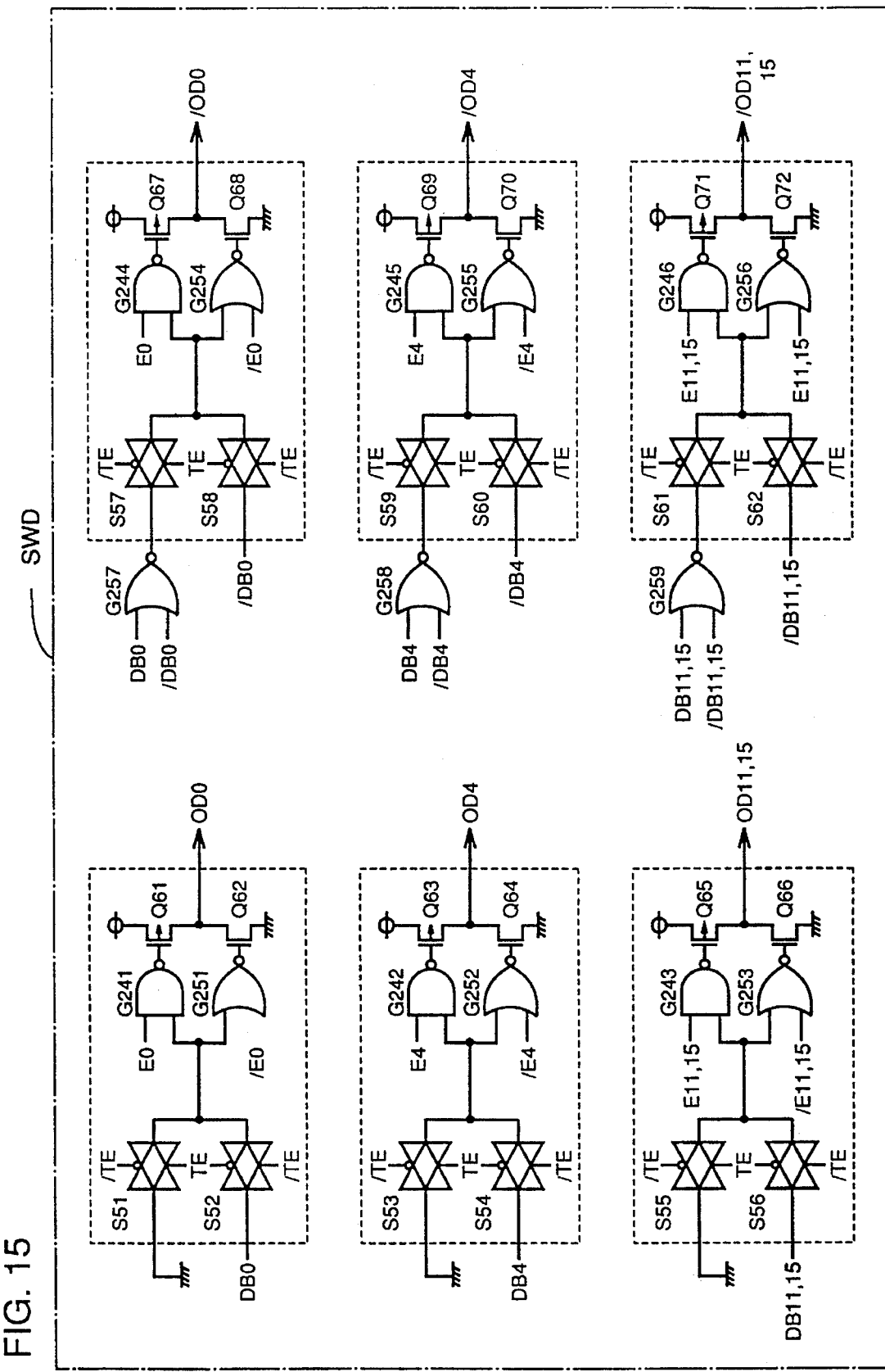
FIG. 15 is a second circuit diagram showing a structure of the fourth switch of FIG. 12.
Figure 16:
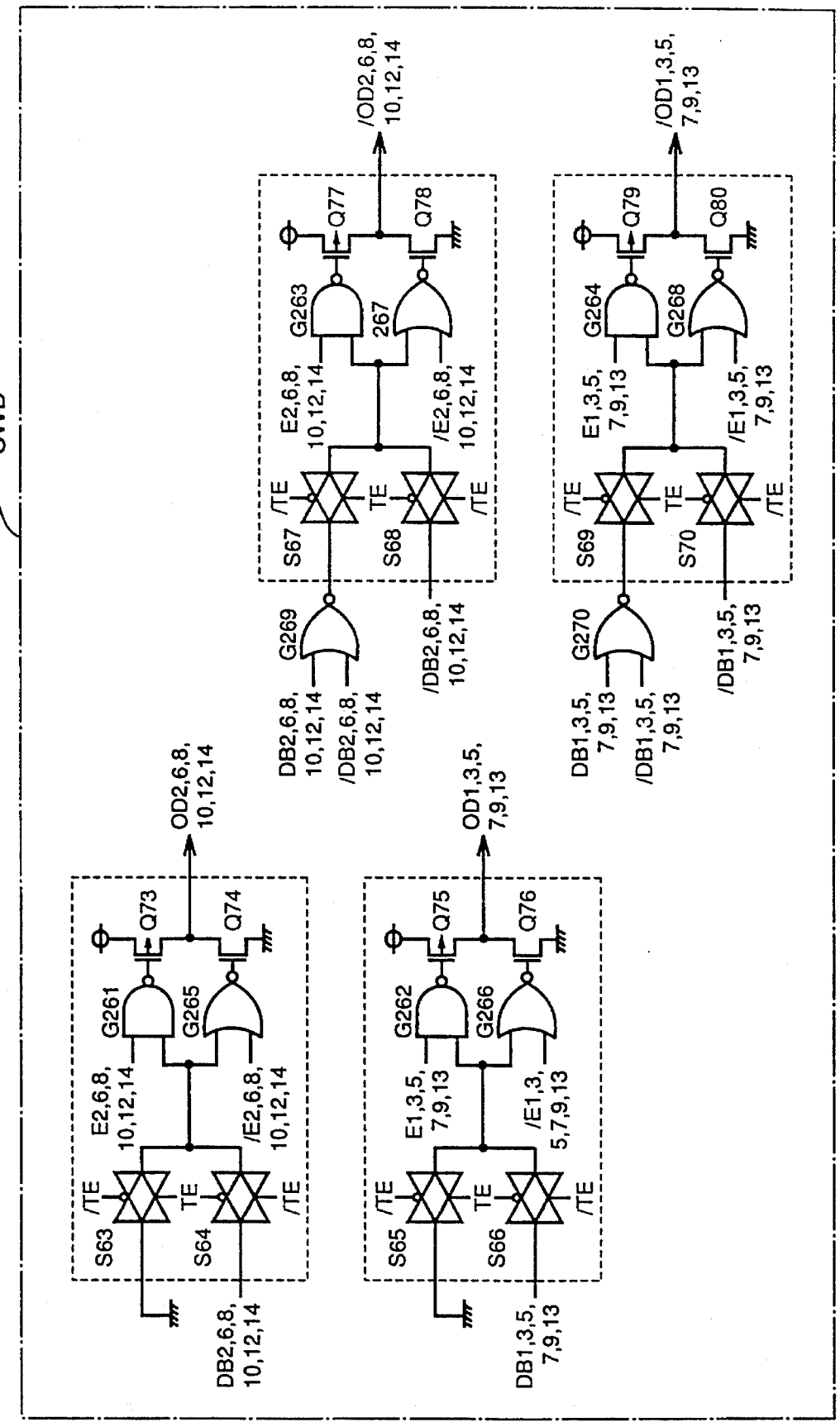
FIG. 16 is a third circuit diagram showing a structure of the fourth switch of FIG. 12.

Referring to FIGS. 14 to 16, a fourth switch includes NAND gates G221–G225, G241–G246, G261–G264, inverters G226–G235, NOR gates G239, G251–G259, G265–G270, OR gates G236–G238, switches S51–S70 and transistors Q61–Q80.

Data transmitted by data buses DB–OB15 and /DB0–/DB15 are applied to the fourth switch. The fourth switch controls the data to be provided to data output signal lines OD–OD15, /OD0–/OD15 according to each bit organization of x1, x4, x8 and x16 bits.

In a x1 bit organization or in a general test mode, x1 bit organization select signal x1 or general test mode signal φA attains a H level, whereby output signal EO of inverter G226 attains a L level, and output signal /EO of inverter G231 attains a H level. Here, the fourth switch provides an output signal from the fourth selector of Fig 13, and does not output a signal towards data output signal lines OD and /OD0.

In a bit organization other than x1 bit and not in a general test mode, the fourth switch provides an output signal to data output signal lines OD and /OD in any of the bit organization of x4 and x8 and x16 bits.

In a x4 bit organization, x4 bit organization select signal x4 attains a H level, whereby output signals E0, E4, E11, and E115 of inverters G226, G227 and G228, respectively, attain a H level, and output signals /E0, /E4, /E11, and /E15 of inverters G231, G232, and G233, respectively, attain a L level. Therefore, an output signal is provided to data output circuit MA via data output signal lines OD0, /OD0, OD4, /OD4, OD11, /OD11, OD15 and /OD15. Here, the other output data lines attain a high impedance state.

In an independent test mode, test mode signal TE attains a H level, whereby the signal of data output signal line OD attains a L level The signal of data output signal line/OD attains a H level when both the signals of data buses DB and /DB attain a L level, otherwise, attains a L level. More specifically, when data in the data buses mismatch, signals in data output signal lines OD and /OD attain a L level and a H level, respectively. When the data match, the signals of data output signal lines OD and /OD both attain a L level.

In a x8 bit organization, similar to the case of a x4 bit organization, the fourth switch operates to provide output signals to data output signal lines OD0, /OD0, OD2, /OD2, OD4, /OD4, OD6, /OD6, OD8, /OD8, OD10, /OD10, OD12, /OD12, OD14, and /OD14. In a x16 bit organization, output signals are provided from the fourth switch to all the data signal output lines OD–OD15 and /OD0–/OD15.

The data output circuit MA shown in FIG. 1 will be described in detail with reference to the circuit diagram of FIG. 17.

Figure 17:
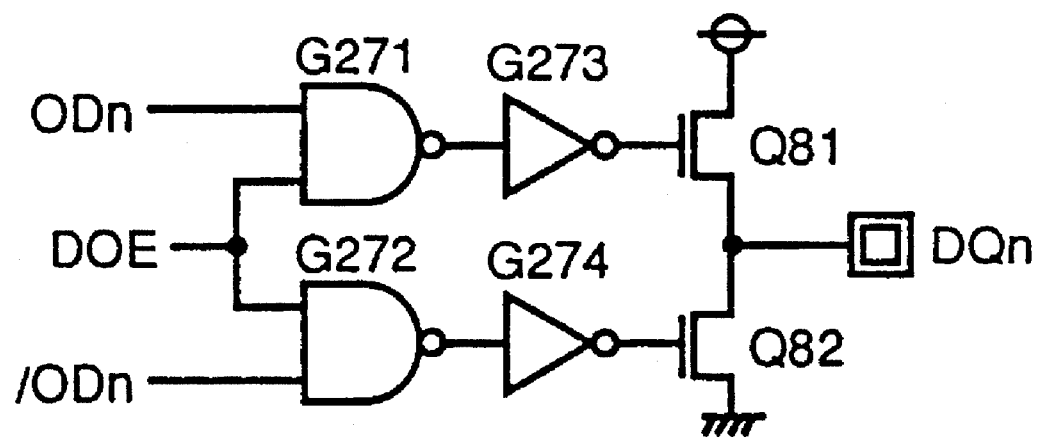
FIG. 17 is a circuit diagram showing a structure of the data output circuit of FIG. 1.
Figure 18:
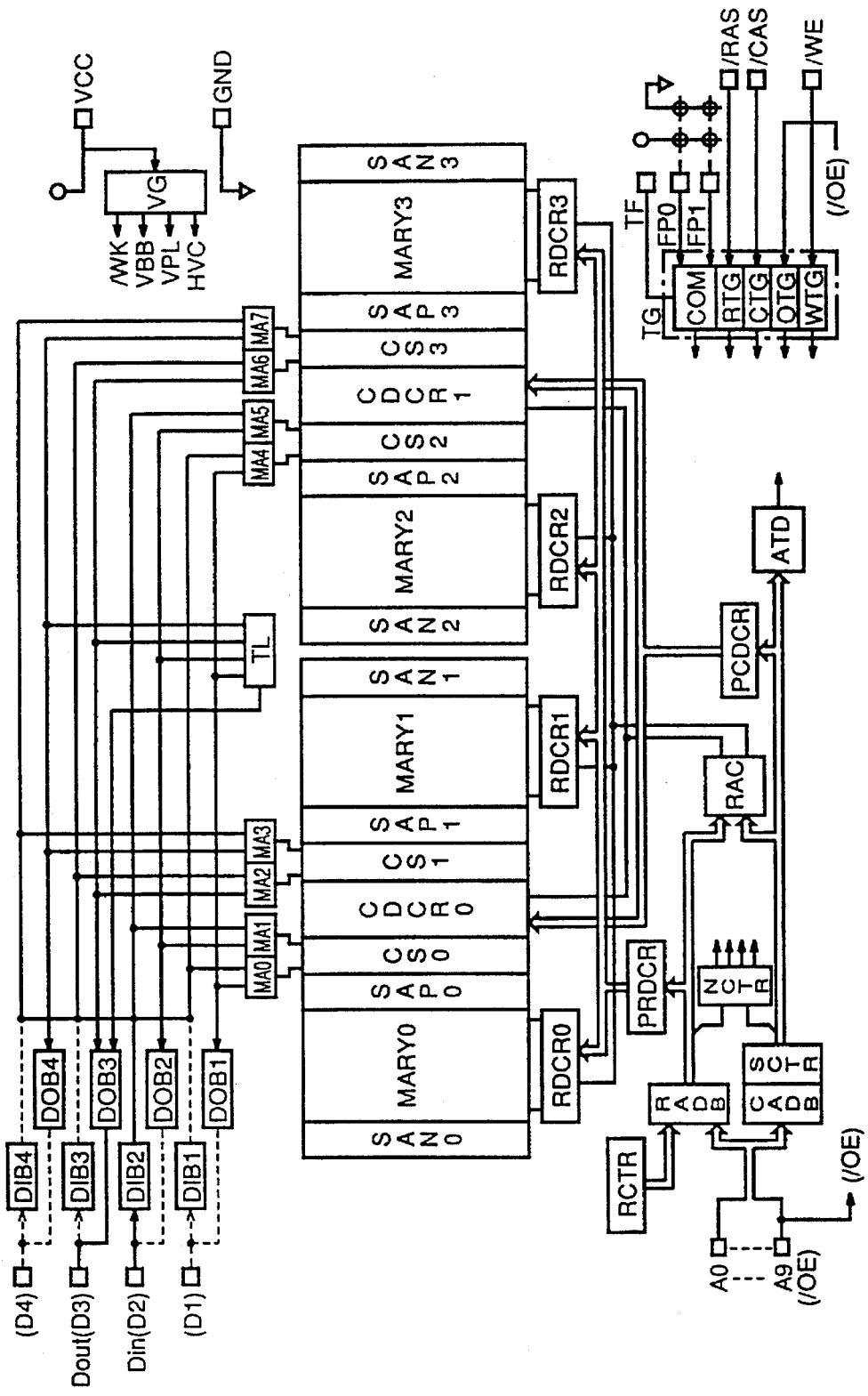
FIG. 18 is a block diagram showing a structure of a conventional semiconductor memory device.
Figure 19:
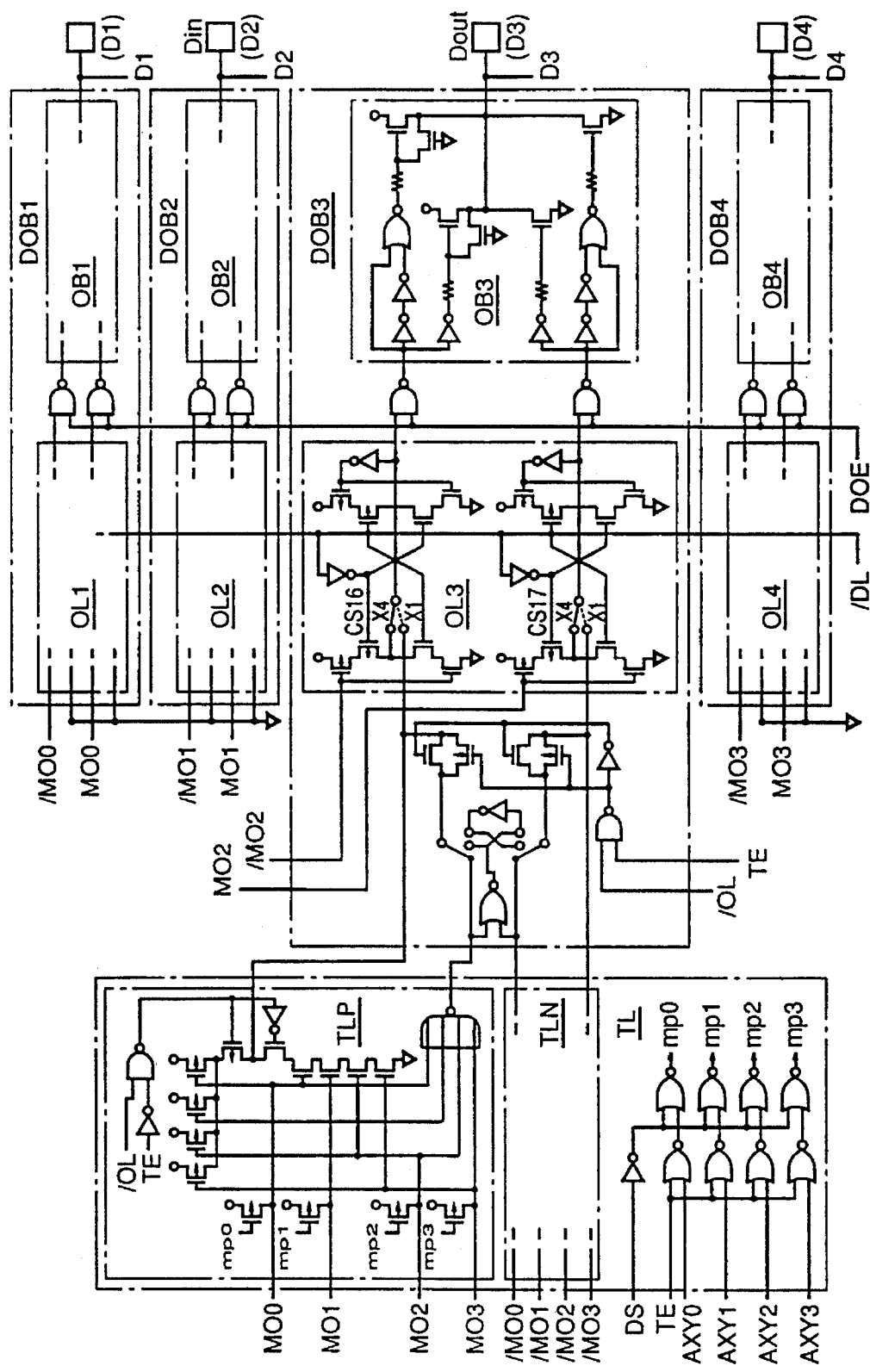
FIG. 19 is a circuit diagram showing a structure of the test logic circuit and the data output buffer of FIG. 1.

Referring to FIG. 17, a data output circuit includes NAND gates G271, G272, inverters G273 and G274, and transistors Q81 and Q82.

The data output circuit responds to a signal transmitted from data output signal lines OD–OD15 and /OD0–/OD15 to provide the same to input/output pads DQ0–DQ15. Control signal DOE controls the timing of data output. When control signal DOE attains a H level, data is output. When control signal DOE attains a L level, input/output pads DQ0–OQ15 attain a high impedance state.

Because selection of data according to the bit organization is carried out by selector units SEL1–SEL4 located prior to data buses DB–OB15 and /DB0–/DB15, an unrequired data bus will not be used. Therefore, increase in the access time period due to variation in the delay between the data buses can be suppressed to realize high speed access operation. Therefore, the operation speed of the device can be improved. Furthermore, power consumption can be reduced since charge/discharge of an unrequired data bus is not carried out. These advantages are significant not only in a normal operation, but also in a test mode.

Because testing can be carried out using data buses identical to those used in a general read out operation, testing of the access time period can be carried out by a test mode.

In the above embodiment, complementary signal lines are used as data buses. Therefore, when the data transmitted through a data bus attains a H level, signals of data buses DB and /DB attain a H level and a L level, respectively. When the transmitted data attains a L level, the signals of data buses DB and /DB attain a L level and a H level, respectively. Therefore, in a pair of signal lines, only the information of one data attaining a H or L level can be transmitted. Because selector units SEL1–SEL4 are provided preceding the data buses in the present embodiment, the signals of data buses DB and /DB attain a L level and a H level, respectively, when the data match at the level of H in a test mode. When data match at a L level, the signals of data buses DB and /DB attain a H level and a L level, respectively. When data do not match, the signals of data buses DB and /DB both attain a L level. It is therefore possible to transmit three types of information with one pair of signal lines in the test mode. Thus, the number of signal lines can be reduced to allow increase in the integration density of the device.

Because the voltage level of all the pads other than input/output pad DQ0 to which the general test result is provided will not attain a H level in either the general test and independent test mode, the signal of data bus DB provided to data output circuit MA will never attain a H level. Therefore, the signal of data bus DB can be fixed to a L level in both the general and independent test modes. Therefore, the circuit complexity of data output circuit MA can be reduced to allow increase in the integration density of the device. By fixing the signal to a L level before data buses DB and /DB, the charge/discharge current of the data bus can be reduced to lower the power consumption of the device. Because the potential of the signal is fixed to a L level which is the ground potential, a voltage generation circuit for generating that potential can be eliminated to further reduce the circuit complexity.

In the above-described embodiment, data can be output according to the selected bit organization and the comparison result of data can be output on the basis of a test mode signal and a bit organization select signal. It is therefore possible to manufacture devices differing in bit organization or in test mode with one chip by a process such as wire bonding in the last stage of the manufacturing process. Various types of devices can be manufactured to promptly meet the variety of needs of the users at a low cost. The present invention is not limited to a DRAM, and can be applied to a semiconductor memory device that carries out switching of the bit organization and the test mode such as a SRAM (Static Random Access Memory).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a plurality of memory blocks for storing data, a plurality of preamplifiers provided corresponding to said plurality of memory blocks for amplifying selected data, and output select means receiving an output signal from the plurality of preamplifiers and a mode select signal to select a mode of bit organization for selecting and providing output signals of said plurality of preamplifiers at respective different states according to said mode select signal, said semiconductor memory device having at least three modes of bit organization among the modes of bit organizations X1, X4, X8 and X16 from which said mode of bit organization can be selected.

2. A semiconductor memory device comprising:

a plurality of memory blocks for storing data, a plurality of preamplifiers provided corresponding to said plurality of memory blocks for amplifying selected data, and a select unit for selecting in a hierarchy manner and providing a plurality of output signals from said plurality of preamplifiers by first and second select circuits, wherein said select unit further comprises first switch means identical in number to said first select circuit, and second switch means identical in number to said second select circuit, said semiconductor memory device further comprising data buses identical in number to said first switch means.

3. A semiconductor memory device comprising:

a plurality of memory blocks for storing data, a plurality of preamplifiers provided corresponding to said plurality of memory blocks for amplifying selected data, and a select unit for selecting in a hierarchy manner and providing a plurality of output signals from said plurality of preamplifiers by first and second select circuits, wherein said select unit further comprises a third select circuit for further selecting in a hierarchy manner an output signal from said plurality of preamplifiers.

4. A semiconductor memory device comprising:

a plurality of memory blocks for storing data, a plurality of preamplifiers provided corresponding to said plurality of memory blocks for amplifying selected data, and a select unit for selecting in a hierarchy manner and providing a plurality of output signals from said plurality of preamplifiers by first and second select circuits, wherein there are two memory cell arrays including said plurality of memory blocks, wherein said select unit is provided between said two memory cell arrays, and a data line is provided substantially at the middle of said two memory cell arrays.

5. The semiconductor memory device according to claim 4, further comprising output means for providing an output signal from said select unit in a nibble mode.

6. The semiconductor memory device according to claim 5, wherein there are two of said plurality of memory blocks, said plurality of preamplifiers, said select units, and said output means, wherein one of said output means is deactivated when the other of said output means is activated.

7. A semiconductor memory device for carrying out input and output of data in a predetermined bit organization according to a bit organization control signal, comprising:

a memory cell array for storing said data, a row decoder and a column decoder for selecting predetermined data from said memory cell array, a preamplifier for amplifying data output from said memory cell array, a select unit responsive to said bit organization control signal for selecting said predetermined bit organization of data output from said preamplifier, a data bus for transmitting data selected by said select unit, and output means for providing data transmitted by said data bus, said semiconductor memory device having at least three modes of bit organization among the modes of bit organizations X1, X4, X8 and X16 from which said predetermined bit organization can be selected.

8. The semiconductor memory device according to claim 7, wherein said select unit further comprises test means responsive to a test mode control signal for providing a predetermined test result according to said bit organization on the basis of data output from said preamplifier, wherein said data bus transmits a test result of said test means, wherein said output means further comprises test result output means for providing said test result transmitted by said data bus.

9. A semiconductor memory device for carrying out input and output of data in a predetermined bit organization according to a bit organization control signal, comprising:

a memory cell array for storing said data;

a row decoder and a column decoder for selecting predetermined data from said memory cell array;

a preamplifier for amplifying data output from said memory cell array;

a select unit responsive to said bit organization control signal for selecting data output from said preamplifier;

a data bus for transmitting data selected by said select unit; and output means for providing data transmitted by said data bus, wherein said select unit further comprises test means responsive to a test mode control signal for providing a predetermined test result according to said bit organization on the basis of data output from said preamplifier, said data bus transmits a test result of said test means, said output means further comprises test result output means for providing said test result transmitted by said data bus, said select unit comprises a first select circuit for selecting and providing either one data selected from 4 data output from said preamplifier, or a test result indicating one of match and mismatch of said 4 data, a second select circuit for selecting and providing either one data selected from 2 data output from said first select circuit, or a test result indicating one of match and mismatch of said two data, a third select circuit for selecting and providing either one data selected from the 4 data output from said first select circuit or a test result indicating one of match and mismatch of said 4 data, and switch means for controlling the connection state of said first to third select circuits and said data bus, and said output means comprises a fourth select circuit for selecting and providing either one data selected from 4 data output from said third select circuit via said switch means and said data bus or a test result indicating one of match and mismatch of said 4 data, and a fifth select circuit responsive to said bit organization control signal and said test mode control signal for selecting and providing a predetermined data or a test result out of data and a test result input via said data bus.

10. The semiconductor memory device according to claim 8, wherein said select unit provides when data is selected, said selected data to said data bus as two signals complementary to each other, when a test result is selected, said selected test result to said data bus as signals of 2 bits.

11. A semiconductor memory device for carrying out input and output of data in a predetermined bit organization according to a bit organization control signal, comprising:

a memory cell array for storing said data;

a row decoder and a column decoder for selecting predetermined data from said memory cell array;

a preamplifier for amplifying data output from said memory cell array;

a select unit responsive to said bit organization control signal for selecting data output from said preamplifier;

a data bus for transmitting data selected by said select unit; and output means for providing data transmitted by said data bus, wherein said select unit further comprises test means responsive to a test mode control signal for providing a predetermined test result according to said bit organization on the basis of data output from said preamplifier, said data bus transmits a test result of said test means, said output means further comprises test result output means for providing said test result transmitted by said data bus, said test result output means comprises first test result output means for providing said test results by a plurality of pairs of first complementary signals, and second test result output means for providing said test result by one pair out of a plurality of pairs of second complementary signals, said plurality of pairs of second complementary signals being identical in number to said plurality of pairs of first complementary signals, said first test result output means provides said plurality of pairs of first complementary signals at one of first and second potential levels respectively according to said test result, and said second test result output means fixes, to one of said first and second potential levels, the level of one signal of a pair of second complementary signals that does not output said test result out of said plurality of pairs of second complementary signals, and outputs the same.

12. A semiconductor memory device for carrying out input and output of data in a predetermined bit organization according to a bit organization control signal, comprising:

a memory cell array for storing said data;

a row decoder and a column decoder for selecting predetermined data from said memory cell array;

a preamplifier for amplifying data output from said memory cell array;

a select unit responsive to said bit organization control signal for selecting data output from said preamplifier;

a data bus for transmitting data selected by said select unit; and output means for providing data transmitted by said data bus, wherein said semiconductor memory device further comprises a plurality of blocks arranged in a divided manner, each including said memory cell array, said row decoder, and said column decoder, and address signal output means for providing an address signal to select a predetermined memory cell from said memory cell array to said row decoder and said column decoder, said address signal output means being disposed to take a distance substantially equal from each of said plurality of blocks.

13. A semiconductor memory device for carrying out input and output of data in a predetermined bit organization according to a bit organization control signal, comprising:

a memory cell array for storing said data;

a row decoder and a column decoder for selecting predetermined data from said memory cell array;

a preamplifier for amplifying data output from said memory cell array;

a select unit responsive to said bit organization control signal for selecting data output from said preamplifier;

a data bus for transmitting data selected by said select unit; and output means for providing data transmitted by said data bus, wherein said memory cell array includes a plurality of memory cell arrays disposed in a divided manner, said semiconductor memory device further comprises address signal input means for receiving an address signal, and data input/output means for carrying out input and output of data, said plurality of memory cell arrays are divided into a first region and a second region, said address signal input means is disposed between said plurality of memory cell arrays in said first region, and said data input/output means is disposed between said plurality of memory cell arrays in said second region.

14. The semiconductor memory device for providing at a predetermined bit organization a test result of data stored according to a test mode control signal, comprising:

a memory cell array for storing said data, a row decoder and a column decoder for selecting predetermined data from said memory cell array, a preamplifier for amplifying data of a memory cell selected by said row decoder and said column decoder, test result output means responsive to said test mode control signal for providing a predetermined test result according to said bit organization on the basis of data output from said preamplifier, a data bus for transmitting a test result of said test result output means, and output means for providing a test result transmitted by said data bus, said semiconductor memory device having at least three modes of bit organization among the modes of bit organizations X1, X4, X8 and X16 at which the predetermined bit organization can be provided.

15. A semiconductor memory device comprising:

a memory cell array for storing data, a row decoder and a column decoder for selecting a predetermined data from said memory cell array, a preamplifier for amplifying data selected by said row decoder and said column decoder, a select unit responsive to a bit organization control signal for selecting at a predetermined bit organization data output from said preamplifier, test result output means responsive to a test mode control signal for providing a predetermined test result on the basis of data output from said preamplifier, a data bus for transmitting either data selected by said select means or a test result of said test result output means, and output means for providing either data or a test result transmitted by said data bus, said semiconductor memory device having at least three modes of bit organization among the modes of bit organizations X1, X4, X8 and X16 at which the predetermined bit organization can be provided, wherein said select unit provides to said data bus said selected data as two signals complementary to each other, and said test result output means provides to said data bus said test result as signals of 2 bits.

16. A semiconductor memory device comprising:

first test result output means for providing a test result by a plurality of pairs of first complementary signals, second test result output means for providing said test result by one pair out of a plurality of pairs of second complementary signals, said plurality of pairs of second complementary signals identical in number to said plurality of pairs of first complementary signals, and output means receiving said first and second complementary signals for providing said test result, wherein said first test result output means provides said plurality of pairs of first complementary signals at one of first and second potential levels according to said test result, wherein said second test result output means fixes, to one of said first and second potential levels, the level of one signal of a pair of second complementary signals that do not output said test result out of said plurality of pairs of second complementary signals, and outputs the same.

* * * * *